US008110478B2

(12) United States Patent
Yamazaki et al.

(10) Patent No.: US 8,110,478 B2
(45) Date of Patent: Feb. 7, 2012

(54) METHOD FOR MANUFACTURING SEMICONDUCTOR SUBSTRATE, DISPLAY PANEL, AND DISPLAY DEVICE

(75) Inventors: Shunpei Yamazaki, Setagaya (JP); Hideto Ohnuma, Atsugi (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 358 days.

(21) Appl. No.: 12/253,301

(22) Filed: Oct. 17, 2008

(65) Prior Publication Data
US 2009/0104750 A1 Apr. 23, 2009

(30) Foreign Application Priority Data

Oct. 23, 2007 (JP) ................................. 2007-275823
Nov. 5, 2007 (JP) ................................. 2007-286996

(51) Int. Cl.
*H01L 21/76* (2006.01)
(52) U.S. Cl. ........ 438/406; 438/459; 438/455; 438/458; 438/409; 438/798; 438/961; 438/938; 257/E21.567; 257/E21.568; 257/E21.536; 257/E21.523
(58) Field of Classification Search ........................ None
See application file for complete search history.

(56) References Cited

U.S. PATENT DOCUMENTS

| 5,374,564 | A | 12/1994 | Bruel | |
|---|---|---|---|---|
| 6,055,030 | A * | 4/2000 | Izumi | ................................ 349/73 |
| 6,140,210 | A | 10/2000 | Aga et al. | |
| 6,232,142 | B1 * | 5/2001 | Yasukawa | ........................ 438/69 |
| 6,251,754 | B1 * | 6/2001 | Ohshima et al. | .............. 438/506 |
| 6,287,941 | B1 | 9/2001 | Kang et al. | |
| 6,399,960 | B1 * | 6/2002 | Yamazaki et al. | .............. 257/59 |

(Continued)

FOREIGN PATENT DOCUMENTS

JP 11-163363 6/1999

(Continued)

OTHER PUBLICATIONS

Sullivan et al., "P-220L: Late-News Poster: Layer-Transfer of Silicon Single-Crystal Films on Large-Area Glass Substrates for Mobile Display Applications," SID '06 Digest, SID International Symposium Digest of Technical Papers, Jun. 2006, pp. 280-282.

*Primary Examiner* — Charles Garber
*Assistant Examiner* — Pape Sene
(74) *Attorney, Agent, or Firm* — Eric J. Robinson; Robinson Intellectual Property Law Office, P.C.

(57) ABSTRACT

If the size of a single crystal silicon layer attached is not appropriate, even when a large glass substrate is used, the number of panels to be obtained cannot be maximized. Therefore, in the present invention, a substantially quadrangular single crystal semiconductor substrate is formed from a substantially circular single crystal semiconductor wafer, and a damaged layer is formed by irradiation with an ion beam into the single crystal semiconductor substrate. A plurality of the single crystal semiconductor substrates are arranged so as to be separated from each other over one surface of a supporting substrate. By thermal treatment, a crack is generated in the damaged layer and the single crystal semiconductor substrate is separated while a single semiconductor layer is left over the supporting substrate. After that, one or a plurality of display panels is manufactured from the single crystal semiconductor layer bonded to the supporting substrate.

26 Claims, 31 Drawing Sheets

U.S. PATENT DOCUMENTS

| | | | |
|---|---|---|---|
| 6,426,270 B1* | 7/2002 | Sakaguchi et al. | 438/406 |
| 6,468,884 B2* | 10/2002 | Miyake et al. | 438/481 |
| 6,624,047 B1* | 9/2003 | Sakaguchi et al. | 438/458 |
| 6,653,209 B1 | 11/2003 | Yamagata | |
| 6,700,142 B1* | 3/2004 | Norman | 257/202 |
| 6,759,277 B1 | 7/2004 | Flores et al. | |
| 6,818,529 B2* | 11/2004 | Bachrach et al. | 438/455 |
| 6,884,694 B2 | 4/2005 | Park et al. | |
| 7,119,365 B2 | 10/2006 | Takafuji et al. | |
| 7,148,124 B1* | 12/2006 | Usenko | 438/458 |
| RE39,484 E | 2/2007 | Bruel | |
| 7,276,427 B2* | 10/2007 | Ichikawa et al. | 438/455 |
| 7,354,844 B2 | 4/2008 | Endo et al. | |
| 7,563,697 B2* | 7/2009 | Morimoto et al. | 438/475 |
| 7,619,250 B2* | 11/2009 | Takafuji et al. | 257/59 |
| 7,638,408 B2 | 12/2009 | Yamazaki et al. | |
| 7,666,757 B2 | 2/2010 | Ohnuma | |
| 7,709,337 B2 | 5/2010 | Jinbo et al. | |
| 7,745,310 B2 | 6/2010 | Shimomura et al. | |
| 7,767,548 B2* | 8/2010 | Ninomiya et al. | 438/459 |
| 7,795,627 B2 | 9/2010 | Yamazaki | |
| 7,846,817 B2 | 12/2010 | Yamazaki et al. | |
| 7,851,332 B2 | 12/2010 | Yamazaki et al. | |
| 7,863,155 B2 | 1/2011 | Yamazaki et al. | |
| 7,910,457 B2 | 3/2011 | Yamazaki | |
| 2001/0003668 A1* | 6/2001 | Yanagita et al. | 438/455 |
| 2001/0038153 A1* | 11/2001 | Sakaguchi | 257/797 |
| 2002/0070454 A1* | 6/2002 | Yasukawa | 257/760 |
| 2002/0102758 A1* | 8/2002 | Yonehara et al. | 438/30 |
| 2003/0094619 A1* | 5/2003 | Akiyama | 257/88 |
| 2003/0201447 A1* | 10/2003 | Yamazaki et al. | 257/79 |
| 2004/0061176 A1* | 4/2004 | Takafuji et al. | 257/347 |
| 2004/0238851 A1 | 12/2004 | Flores et al. | |
| 2005/0032283 A1 | 2/2005 | Itoga et al. | |
| 2006/0099791 A1* | 5/2006 | Mitani et al. | 438/612 |
| 2006/0128116 A1* | 6/2006 | Kwon et al. | 438/455 |
| 2006/0262267 A1* | 11/2006 | Sekiguchi | 349/187 |
| 2007/0023066 A1* | 2/2007 | Yokokawa et al. | 134/1.3 |
| 2007/0063281 A1 | 3/2007 | Takafuji et al. | |
| 2007/0105026 A1* | 5/2007 | Yoshizawa et al. | 430/5 |
| 2007/0281172 A1 | 12/2007 | Couillard et al. | |
| 2007/0281440 A1* | 12/2007 | Cites et al. | 438/458 |
| 2008/0038908 A1 | 2/2008 | Henley | |
| 2008/0063840 A1 | 3/2008 | Morita et al. | |
| 2008/0160661 A1 | 7/2008 | Henley | |
| 2008/0237779 A1 | 10/2008 | Yamazaki et al. | |
| 2008/0237780 A1 | 10/2008 | Yamazaki et al. | |
| 2008/0245406 A1 | 10/2008 | Yamazaki et al. | |
| 2008/0251126 A1 | 10/2008 | Yamazaki et al. | |
| 2008/0254560 A1 | 10/2008 | Yamazaki | |
| 2008/0258918 A1 | 10/2008 | Kato et al. | |
| 2009/0075408 A1 | 3/2009 | Yamazaki | |
| 2009/0079024 A1 | 3/2009 | Yamazaki | |
| 2009/0079025 A1 | 3/2009 | Yamazaki | |
| 2009/0081844 A1 | 3/2009 | Yamazaki | |
| 2009/0115028 A1 | 5/2009 | Shimomura et al. | |

FOREIGN PATENT DOCUMENTS

| | | |
|---|---|---|
| JP | 2000-012864 | 1/2000 |
| JP | 2000-150905 | 5/2000 |
| JP | 2003-257804 | 9/2003 |
| JP | 2005-539259 | 12/2005 |

* cited by examiner

FIG. 10A
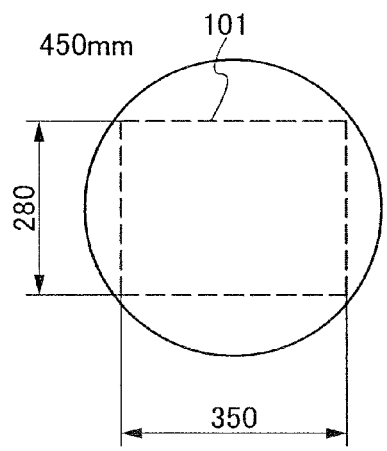
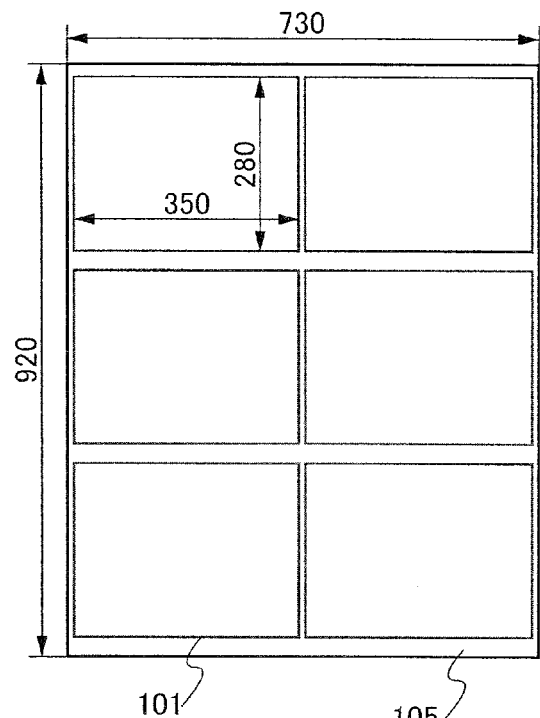
FIG. 10B
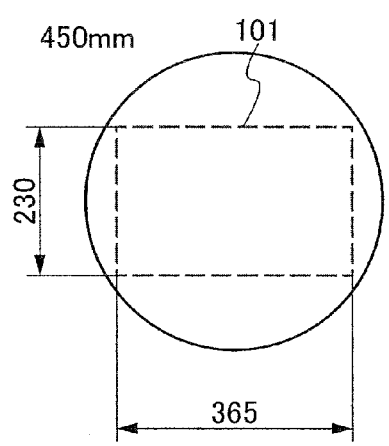
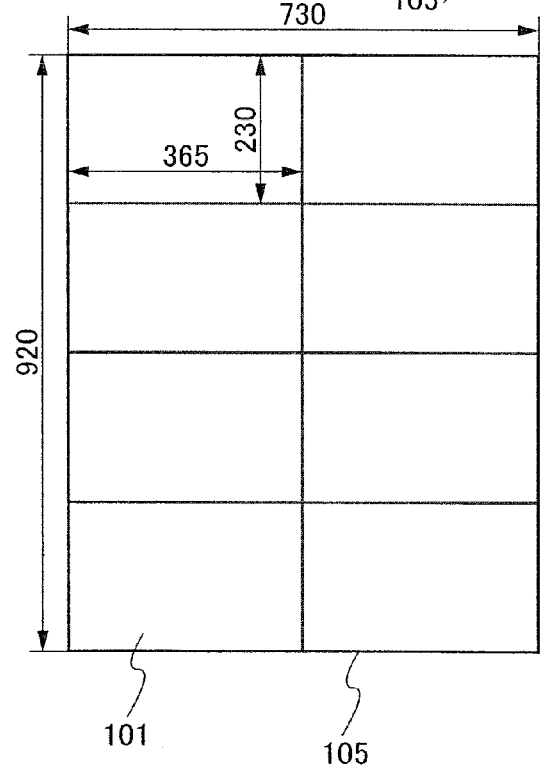

FIG. 11A
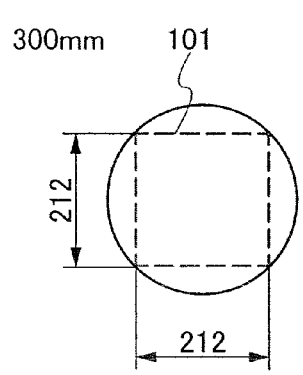
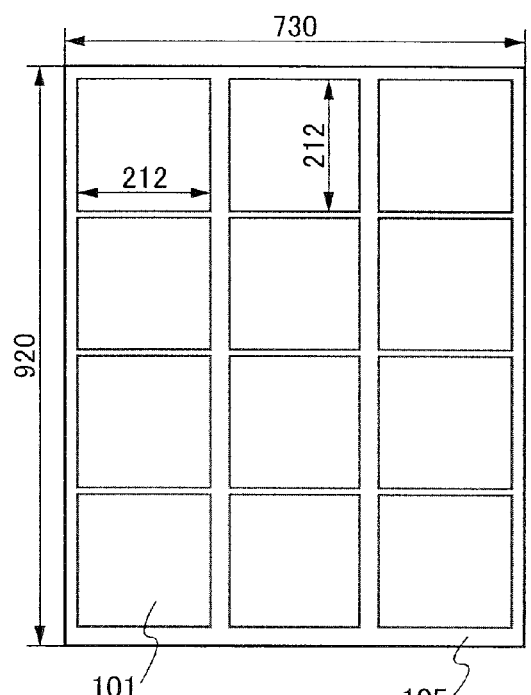
FIG. 11B
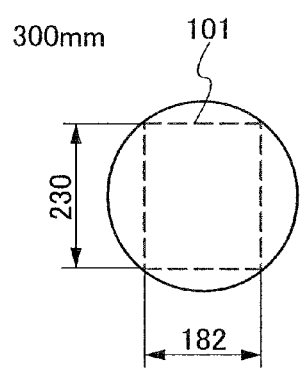
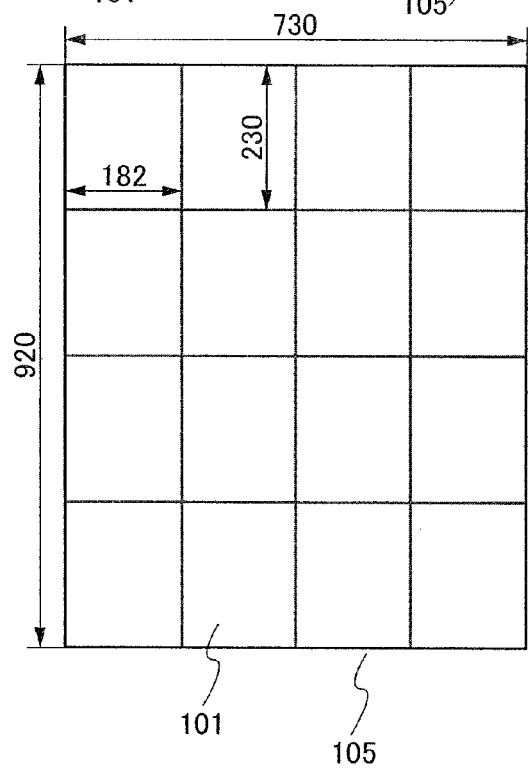

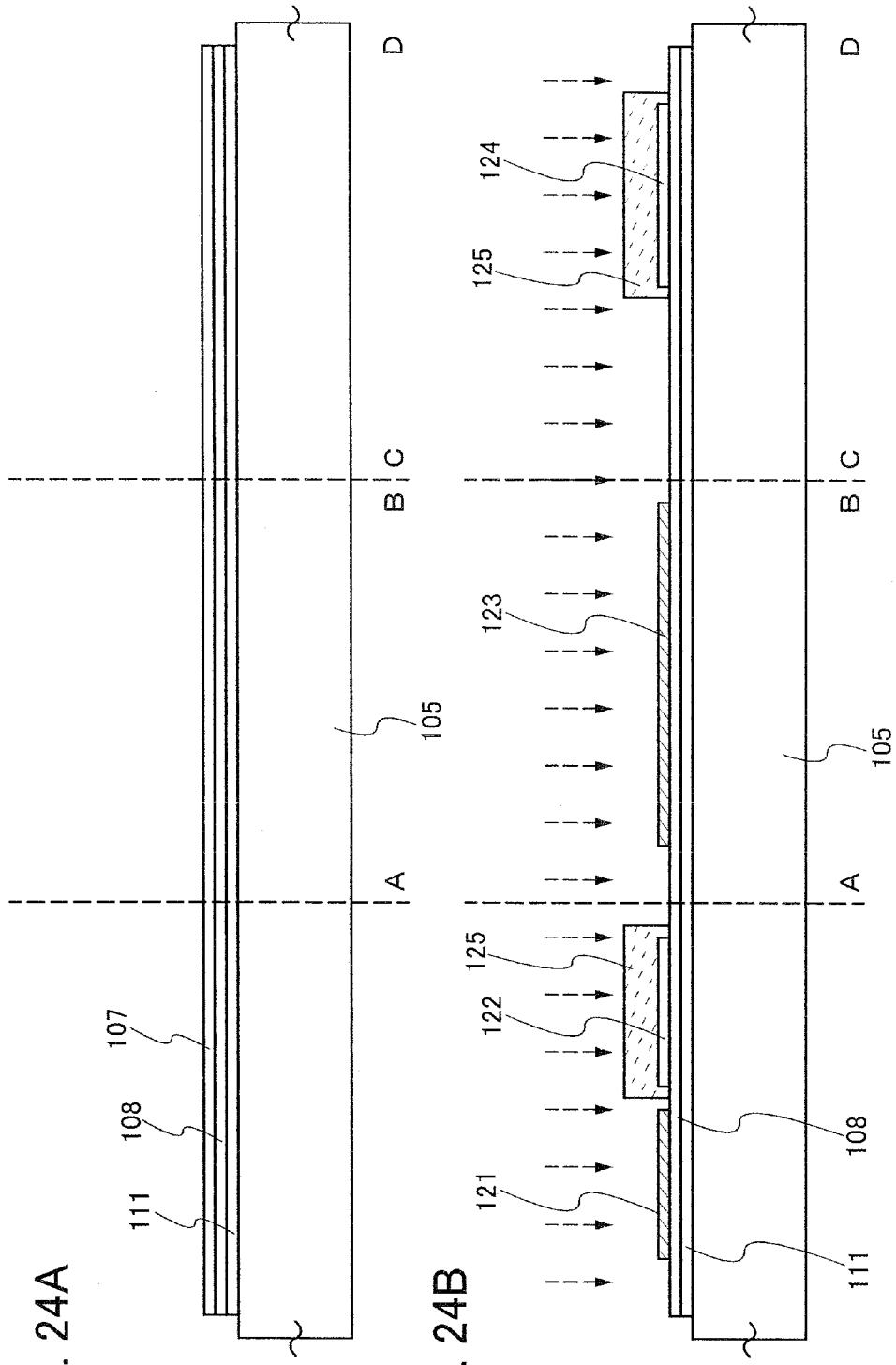

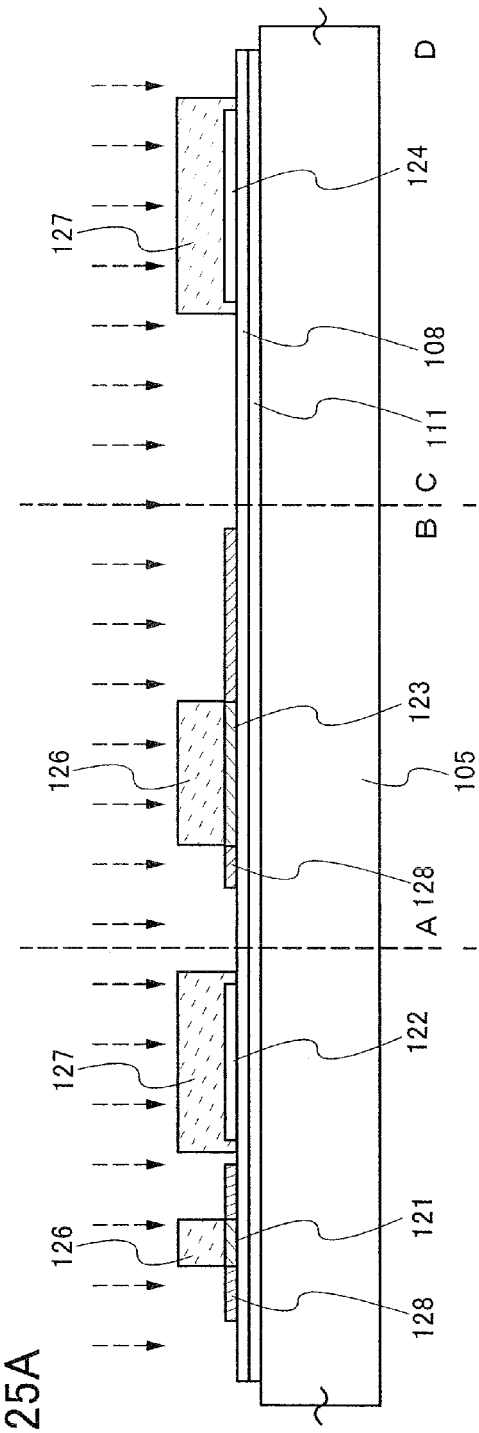
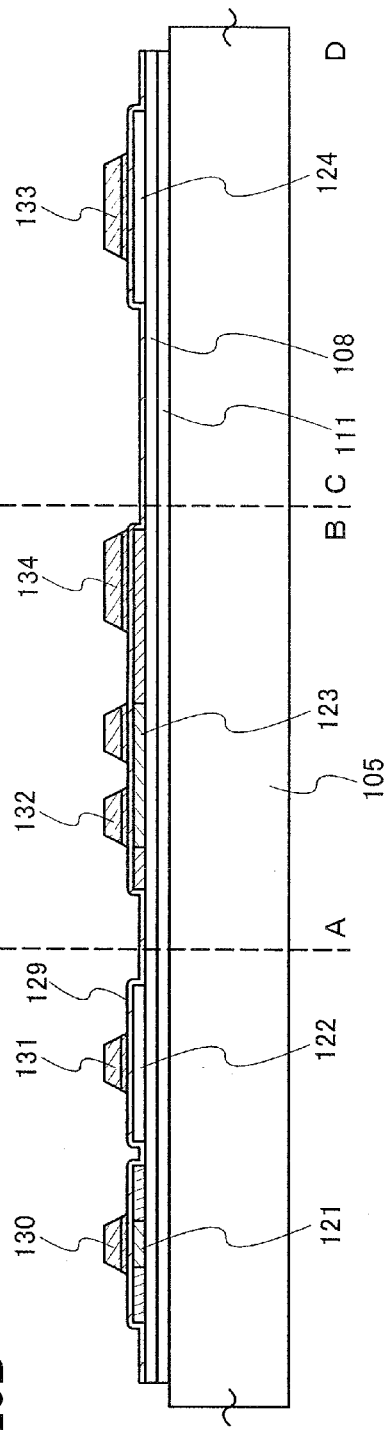
FIG. 25A
FIG. 25B

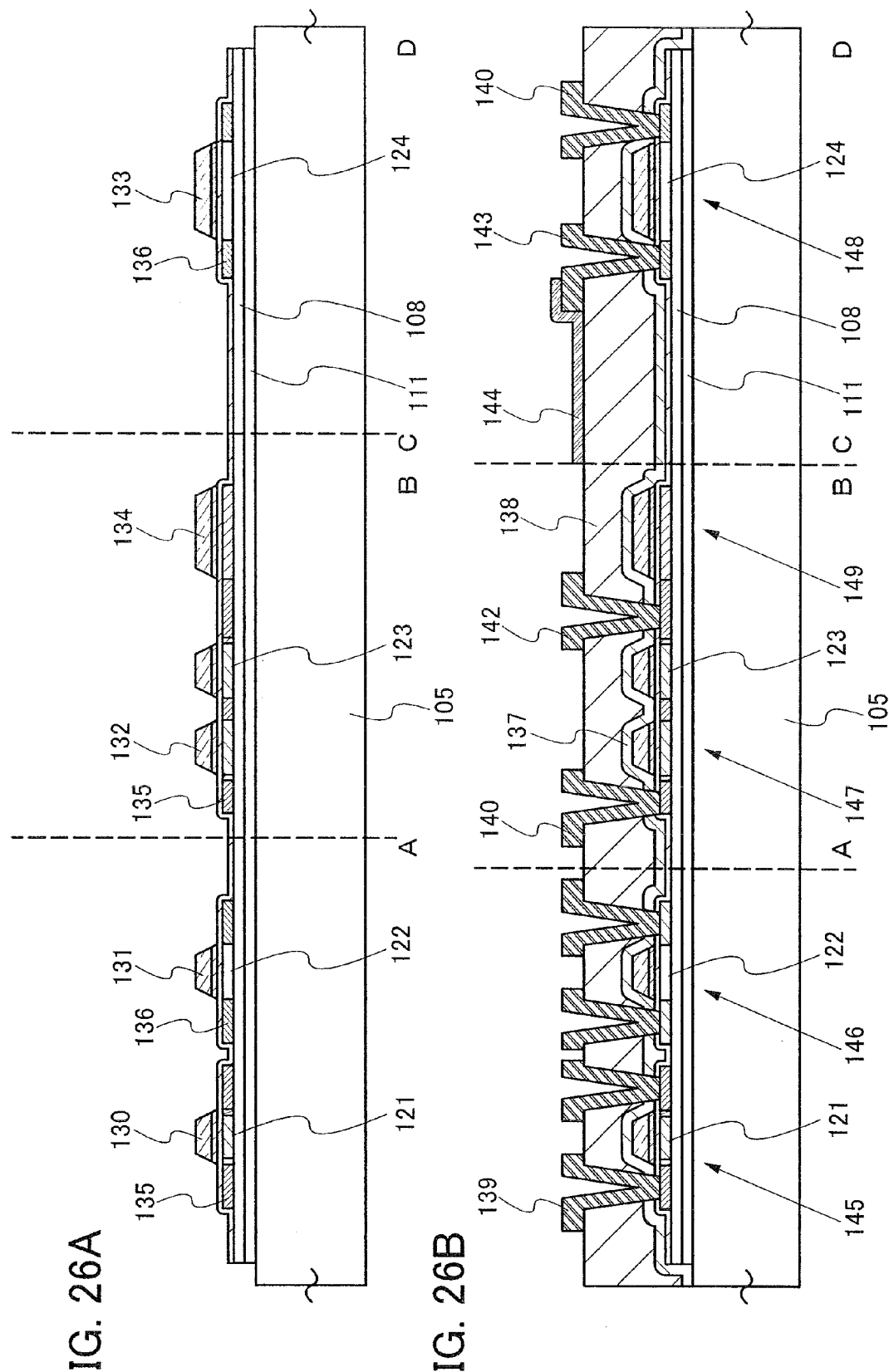

FIG. 31A
FIG. 31B
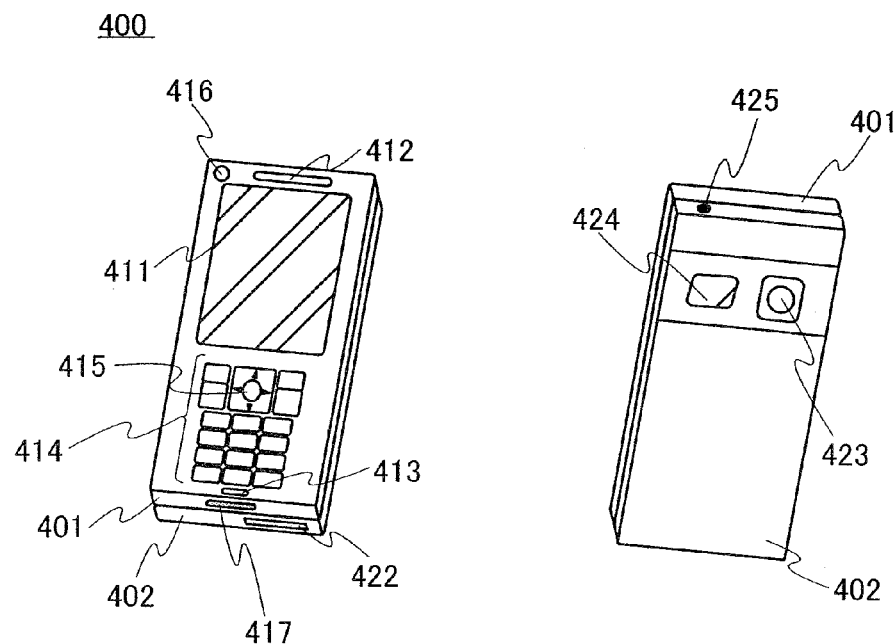
FIG. 31C
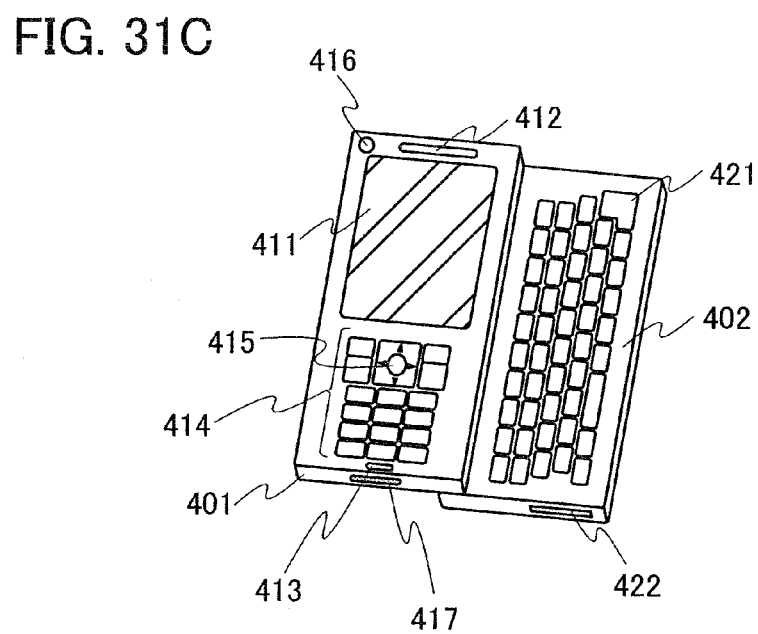

METHOD FOR MANUFACTURING SEMICONDUCTOR SUBSTRATE, DISPLAY PANEL, AND DISPLAY DEVICE

BACKGROUND OF THE INVENTION

1. Field of the Invention

This invention belongs to the technical field of a semiconductor substrate, a display panel, or a display device, formed by using SOI (silicon on insulator) technology.

2. Description of the Related Art

The market of liquid crystal displays using thin film transistors has been expanded. Thin film transistors are one kind of field effect transistors and are so called because semiconductors that form channels are formed of thin films. Ideally, it would be good if thin film transistors whose channels are formed of single crystal semiconductors could be manufactured; however, amorphous silicon thin films or polycrystalline thin films which can be manufactured at a process temperature of 600° C. or lower are used for the thin film transistors because glass substrates which are to be base materials of liquid crystal displays have a low temperature limit.

Of course, a technique for forming a single crystal silicon thin film over an insulating substrate which can be used for a liquid crystal display device has been developed. For example, a technique for forming a single crystal silicon thin film over a crystallized glass substrate which is a high heat-resistant glass is disclosed (see Patent Document 1: Japanese Published Patent Application No. H11-163363, Patent Document 2: Japanese Published Patent Application No. 2000-012864, and Patent Document 3: Japanese Published Patent Application No. 2000-150905). In recent, a technique for making small pieces of single crystal silicon into a tiled pattern over a glass substrate is disclosed as an SOI substrate for an active matrix liquid crystal display (see Patent Document 4: Japanese Translation of PCT International Application No. 2005-539259).

SUMMARY OF THE INVENTION

A liquid crystal panel is formed by a construction method in which a plurality of panels are formed over a glass substrate called a mother glass and the glass substrate is divided into individual panels in order to cut cost per panel by obtaining a plurality of panels from one mother glass.

A mother glass for manufacturing a display panel has been grown in size from year to year: 3rd generation (550 mm×650 mm), 3.5th generation (600 mm×720 mm or 620 mm×750 mm), 4th generation (680×880 mm or 730 mm×920 mm), 5th generation (1100 mm×1300 mm), 6th generation (1500 mm×1850 mm), 7th generation (1870 mm×2200 mm) and 8th generation (2200×2400 mm). From now on, a mother glass is expected to grow in size to 9th generation (2400 mm×2800 mm or 2450 mm×3050 mm) and 10th generation (2950 mm×3400 mm).

On the other hand, a silicon ingot or a silicon wafer which is to be a base material for forming a single crystal silicon layer is small compared to the area of a glass substrate (mother glass). Accordingly, a plurality of silicon wafers is necessary to be attached to a large glass substrate; however, a problem that the sizes of a panel and the silicon wafer are not the same is concerned. Even though the plurality of silicon wafers is densely attached to the glass substrate, gaps are generated between silicon wafers which are adjacent to each other. Since a thin film transistor cannot be formed in this gap portion, it is impossible to form a display panel having a screen which is larger than a silicon wafer.

After all, a display panel is formed so as to fit on the size of the silicon wafer. In that case, even if a large glass substrate (mother glass) is used, the number of panels to be obtained cannot be maximized when the size of a single crystal silicon layer attached in a tiled pattern is not appropriate. Therefore, a problem is concerned that minimum cost cannot be achieved. This is not only a problem of productivity; since a glass substrate or silicon wafer which is produced with a large amount of energy consumption is not effectively utilized, resources are not effectively utilized and an energy-saving factory with consideration of environmental problems cannot be constructed.

It is an object of this invention to improve the productivity of a semiconductor substrate, display panel, or display device provided with a single crystal semiconductor layer. In addition, it is an object of this invention to cut waste and to effectively utilize resources in manufacturing a semiconductor substrate, display panel, or display device provided with a single crystal semiconductor layer.

A substantially quadrangular single crystal semiconductor including periphery end portions of the single crystal semiconductor substrate as its vertexes, or a substantially quadrangular single crystal semiconductor substrate accounting for 50% or more of the surface area of the single crystal semiconductor wafer is formed from a substantially circular single crystal semiconductor wafer of 300 to 450 mm in diameter. An ion beam 50% or more of which is a cluster ion of hydrogen, preferably 80% or more, whose mass is heavier than that of a hydrogen molecule is implanted from one surface of the single crystal semiconductor substrate, whereby a damaged layer is formed at a given depth from a surface of the single crystal semiconductor substrate. A bonding layer is formed on a surface side of the single crystal semiconductor substrate, to which the cluster ion is implanted. A plurality of the single crystal semiconductor substrates are arranged over one surface of a supporting substrate having an insulating surface, to be separated from each other with the bonding layer firmly attached. A crack is generated in the damage layer by thermal treatment, and the single crystal semiconductor substrate is separated and then removed while a single crystal semiconductor layer is left over the supporting substrate. The single crystal semiconductor layer is irradiated with a laser beam in a nitrogen atmosphere, and a surface of the single crystal semiconductor layer is flattened. After that, one or a plurality of display panels are manufactured from the single crystal semiconductor layer bonded to the supporting substrate.

According to one aspect of this invention related to a manufacturing method of a display panel, from a substantially circular silicon wafer of 400 mm or more in diameter, by bonding a substantially quadrangular region accounting for 50% or more of a main surface area of the silicon wafer to a supporting substrate having an insulating surface, a plurality of single crystal semiconductor layers with a thickness of 100 nm or less is formed so as to be separated from each other over the supporting substrate. Then, an element region, in which a screen of more than or equal to 10 and less than or equal to 15 inch is formed, is formed over the single crystal semiconductor layer. Alternatively, 10 or more display panels having a screen size of more than or equal to 2 and less than or equal to 7 inch are obtained from one of the single crystal semiconductor layers.

According to one aspect of this invention related to a manufacturing method of a semiconductor substrate, from a silicon wafer of 400 mm or more in diameter, by bonding a substantially quadrangular region accounting for 50% or more of a main surface area of the silicon wafer to a supporting substrate having an insulating surface, a plurality of single crystal semiconductor layers with a thickness of 100 nm or less is formed so as to be separated from each other over the supporting substrate.

Note that a semiconductor substrate is a substrate having an insulating surface or an insulating substrate which is provided with a semiconductor layer at least on its one surface. One mode of a preferred semiconductor substrate of this invention is the one to which a single crystal semiconductor layer, preferably a single crystal silicon layer, is formed as a semiconductor layer.

Here, single crystals are crystals in which crystal planes and crystallographic axes are aligned and atoms or molecules which consist the single crystals are spatially ordered. However, although single crystals are structured by orderly aligned atoms, single crystals may include a lattice defect in which the alignment is disordered as a part or single crystals may include intended or unintended lattice strain.

By making a combination of a single crystal semiconductor substrate, a semiconductor substrate for transfer, which is cut out from the single crystal semiconductor substrate, and a supporting substrate (mother glass) over which a single crystal semiconductor layer is formed, each of which has an appropriate size in consideration of a screen size of a display panel, the number of display panels which can be obtained from one supporting substrate can be maximized. Therefore, the productivity of a semiconductor substrate, display panel, or display device provided with a single crystal semiconductor layer can be improved. Moreover, in manufacturing a semiconductor substrate, display panel, or display device provided with a single crystal semiconductor layer, waste is cut to effectively utilize resources.

BRIEF DESCRIPTION OF THE DRAWINGS

In the accompanying drawings:

FIG. 3A is an enlarged diagram of a corner portion and FIG. 3B is a cross-sectional shape of a peripheral end portion;

FIGS. 10A and 10B each show an aspect in which a semiconductor substrate for transfer is cut out from a silicon wafer of 450 mm in diameter and transferred on a supporting substrate of 730 mm×920 mm;

FIGS. 11A and 11B each show an aspect in which a semiconductor substrate for transfer is cut out from a silicon wafer of 300 mm in diameter and transferred on a supporting substrate of 730 mm×920 mm;

FIGS. 24A and 24B are cross-sectional views of manufacturing steps of a display panel formed by using a single crystal semiconductor layer;

FIGS. 25A and 25B are cross-sectional views of manufacturing steps of a display panel formed by using a single crystal semiconductor layer;

FIGS. 26A and 26B are cross-sectional views of manufacturing steps of a display panel formed by using a single crystal semiconductor layer;

FIGS. 31A to 31C show examples of electronic devices.

DETAILED DESCRIPTION OF THE INVENTION

Figure 1:
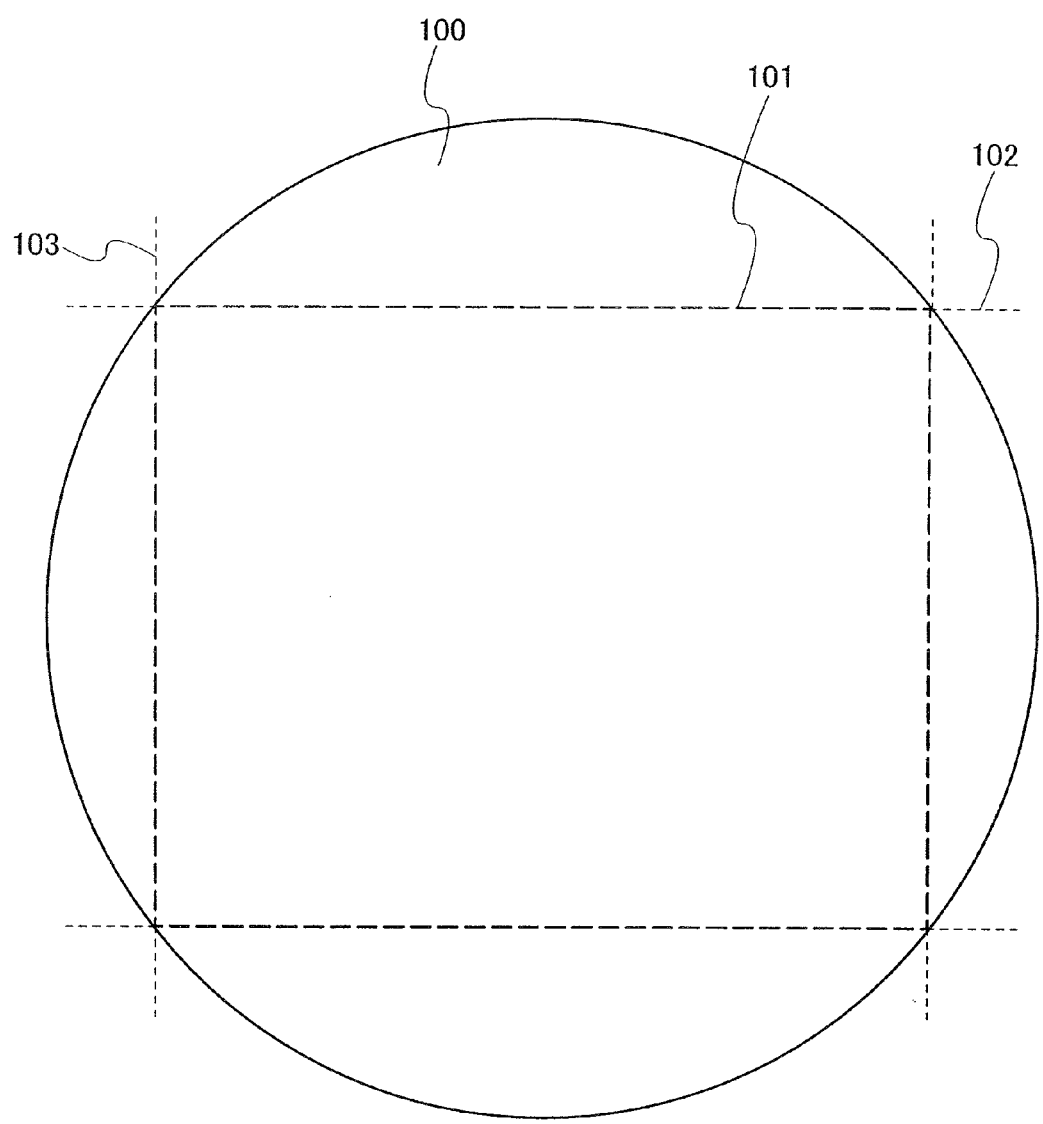
FIG. 1 shows an aspect in which a semiconductor substrate for transfer with a given outline dimension is cut out from a substantially circular single crystal semiconductor substrate.

Embodiment modes of this invention will be described hereinafter, with reference to the drawings. Note that this invention is not limited to the description below, and it is easily understood by those skilled in the art that modes and details can be modified in various ways without departing from the purpose and the scope of this invention. Therefore, this invention is not to be construed with limitation to what is described in the embodiment modes. It is to be noted in the following structure that the reference numeral indicating the same part will be used in common throughout different drawings.

In this embodiment mode, one aspect will be shown in which a substantially quadrangular semiconductor layer is cut out from a substantially circular semiconductor substrate such as a silicon wafer and bonded to a supporting substrate having an insulating surface, in order to manufacture a thin film transistor provided over a pixel region in a display panel by using the single crystal semiconductor layer.

As the supporting substrate, a glass substrate that can be used as a mother glass is employed. In that case, a single crystal semiconductor layer arranged over the supporting substrate preferably has a rectangular shape by being processed but not a substantially circular shape that corresponds to the shape of a silicon wafer as it is. This is because, when single crystal semiconductor layers having a substantially circular shape are arranged, a gap is generated between adjoining single crystal semiconductor layers, whereby the area of the supporting substrate cannot be effectively utilized.

In this embodiment mode, a technique in which a damaged layer is formed to a region in 1 μm or less, preferably 50 nm to 150 nm, from the surface of a single crystal semiconductor substrate, a surface layer portion of the single crystal semiconductor substrate is separated along the damaged layer, and the single crystal semiconductor substrate is bonded to a supporting substrate is employed. These steps will be described in detail in embodiment modes below.

(Method of Processing a Single Crystal Semiconductor Substrate—1)

FIG. 1 shows an aspect in which a semiconductor substrate 101 for transfer with a given outline dimension is cut out from a single crystal semiconductor substrate 100, typically silicon wafer, in a certain size. The semiconductor substrate 101 for transfer can be maximized up to the point of each vertex inscribed in the single crystal semiconductor substrate 100. However, the semiconductor substrate 101 for transfer is not necessary to be square. This is because 4:3 or 16:9 is employed as the aspect ratio of a screen of the display panel, and the outline dimension of the display panel meets the aspect ratio by itself. The size of the silicon wafer is preferably 300 mm or more in diameter. For example, a silicon wafer of 400 mm or 450 mm in diameter (18-inch silicon wafer) may be employed.

Figure 2:
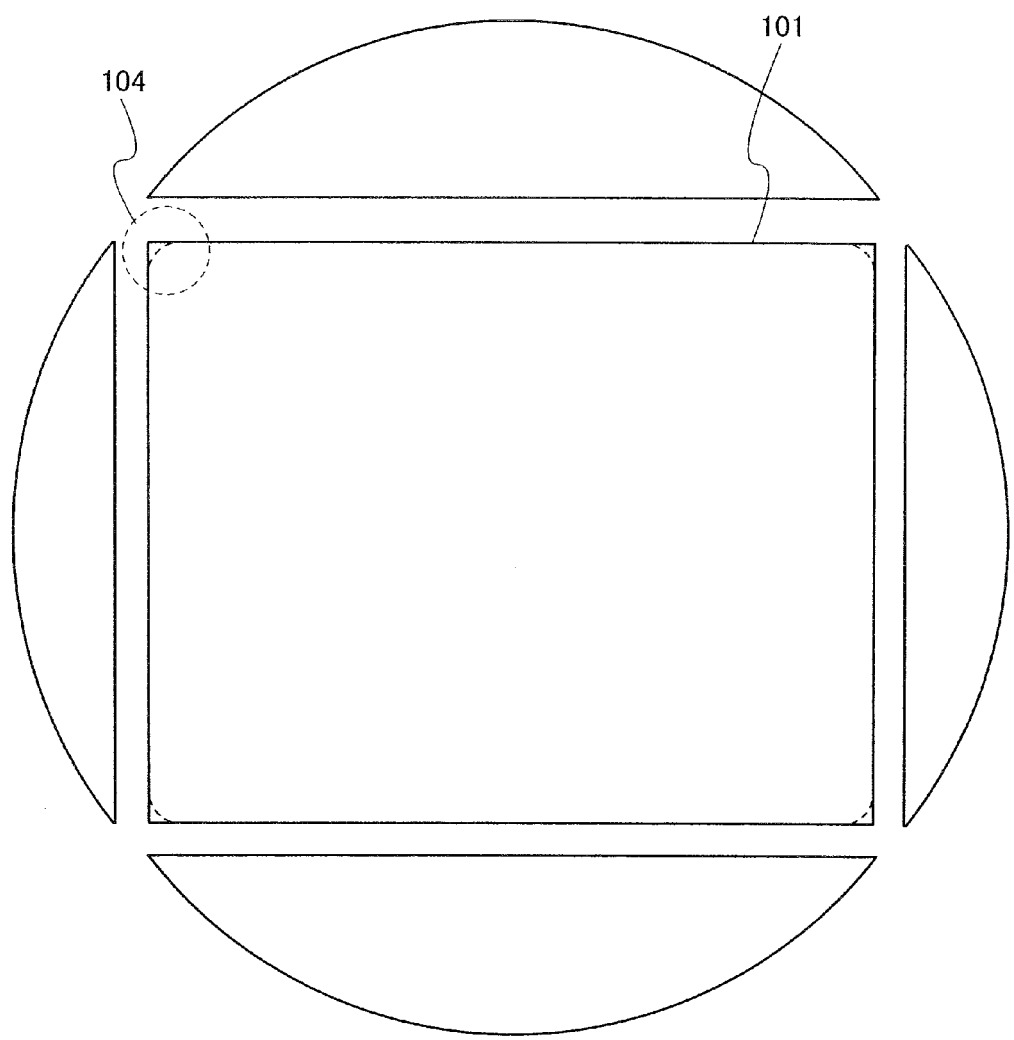
FIG. 2 shows an aspect in which a semiconductor substrate for transfer with a given outline dimension has been cut out from a substantially circular single crystal semiconductor substrate.

As shown in FIG. 2, in the case where the semiconductor substrate 101 for transfer is cut out, with its vertexes inscribed in the form of the single crystal semiconductor substrate 100 to be a quadrangle along a cutoff lines 102 and 103, the degree of a vertex of an angle portion 104 shown in a dashed circle in the figure is substantially 90°. In addition, this is the same as in the case where the semiconductor substrate 101 for transfer is cut out from within the single crystal semiconductor substrate 100.

Figure 3A:
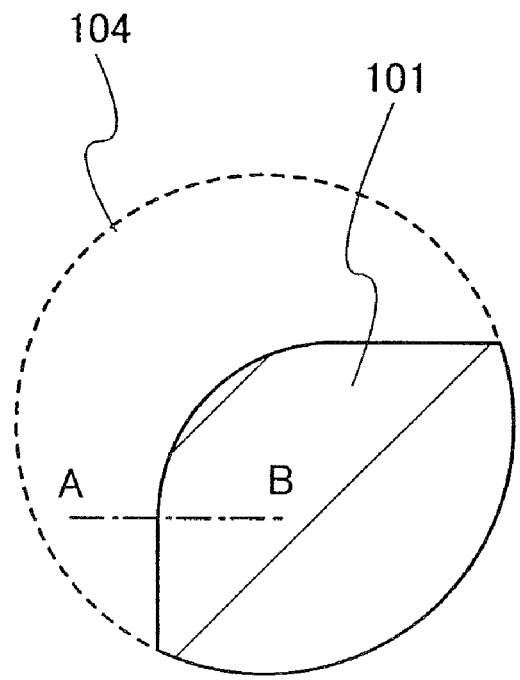
FIGS. 3A and 3B are a structure of a semiconductor substrate for transfer.
Figure 3B:
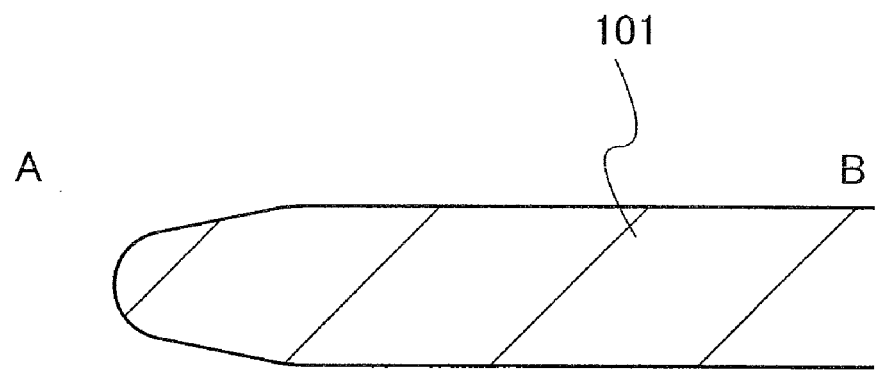

In that case, the angle portion 104 is preferably processed into a curved surface so as not to be a sharp end portion. FIG. 3A is an enlarged diagram of the angle portion 104 and such processing into a curved surface can prevent the semiconductor substrate 101 for transfer from being damaged. As shown in FIG. 3B, it is preferable that a cross-sectional shape of a peripheral end portion of the semiconductor substrate 101 for transfer be chamfered by shaving a sharp angle so as to be processed into a shape with a curved surface or a shape with an angle in multi-steps. This can reduce waste of silicon resources by preventing damage of the substrate. Note that mill ends after cutting-out can be reused. Further, the mill ends can also be used when a small single crystal semiconductor layer is formed.

(Method of Processing a Single Crystal Semiconductor Substrate—2)

Figure 4:
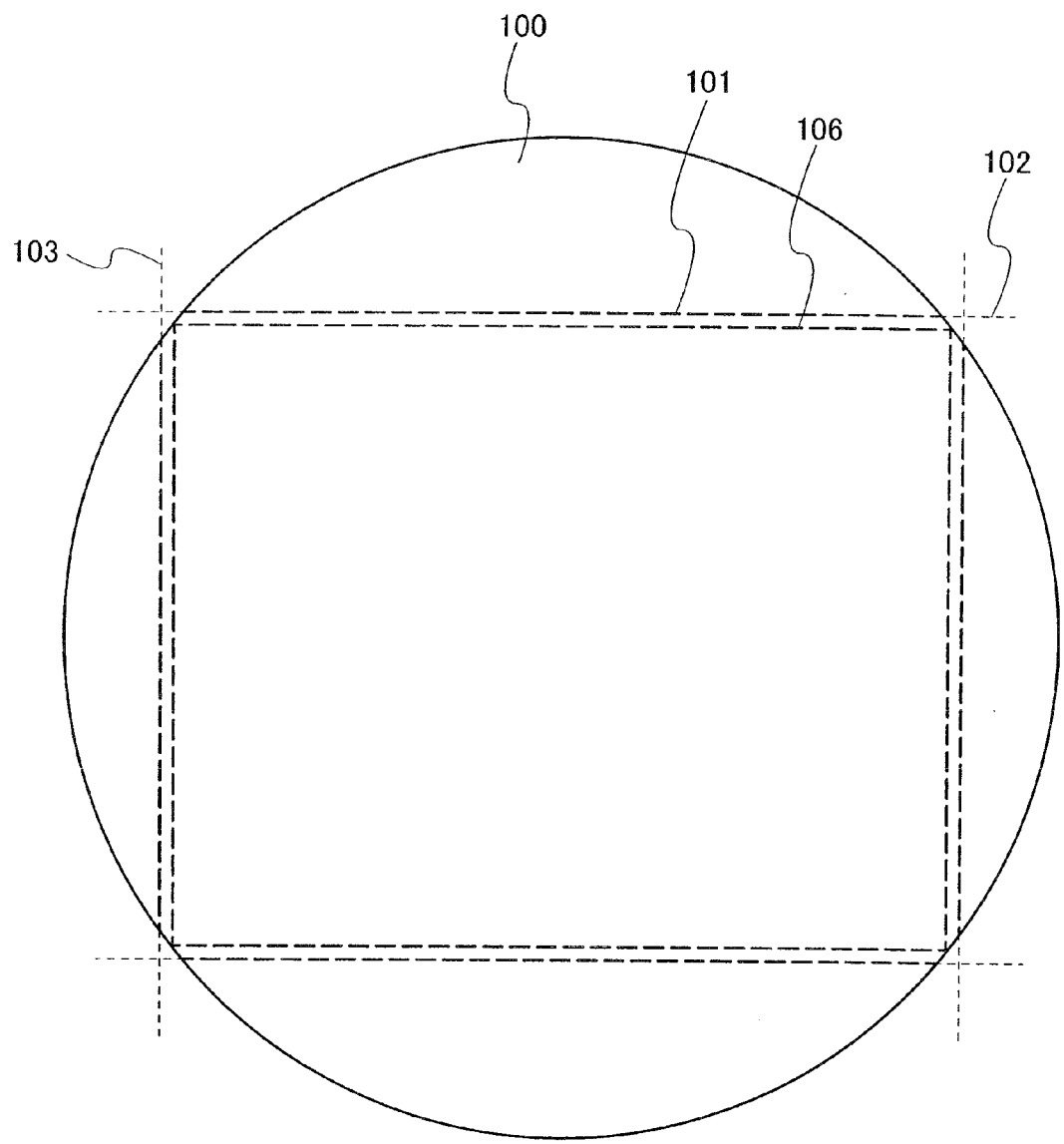
FIG. 4 shows an aspect in which a semiconductor substrate for transfer with a given outline dimension is cut out from a substantially circular single crystal semiconductor substrate.

FIG. 4 shows an aspect in which a semiconductor substrate 101 for transfer with a given outline dimension is cut out from a single crystal semiconductor substrate 100, typically silicon wafer, in a certain size. The semiconductor substrate 101 for transfer can be maximized up to the point of each vertex inscribed in the single crystal semiconductor substrate 100. However, the semiconductor substrate 101 for transfer is not necessary to be square. This is because 4:3 or 16:9 is employed as a standard of the aspect ratio of a screen of the display panel, and the outline dimension of the display panel meets the aspect ratio by itself. The size of the silicon wafer is preferably 300 mm or more in diameter. For example, a silicon wafer of 400 mm or 450 mm in diameter (18-inch silicon wafer) may be employed.

Figure 5:
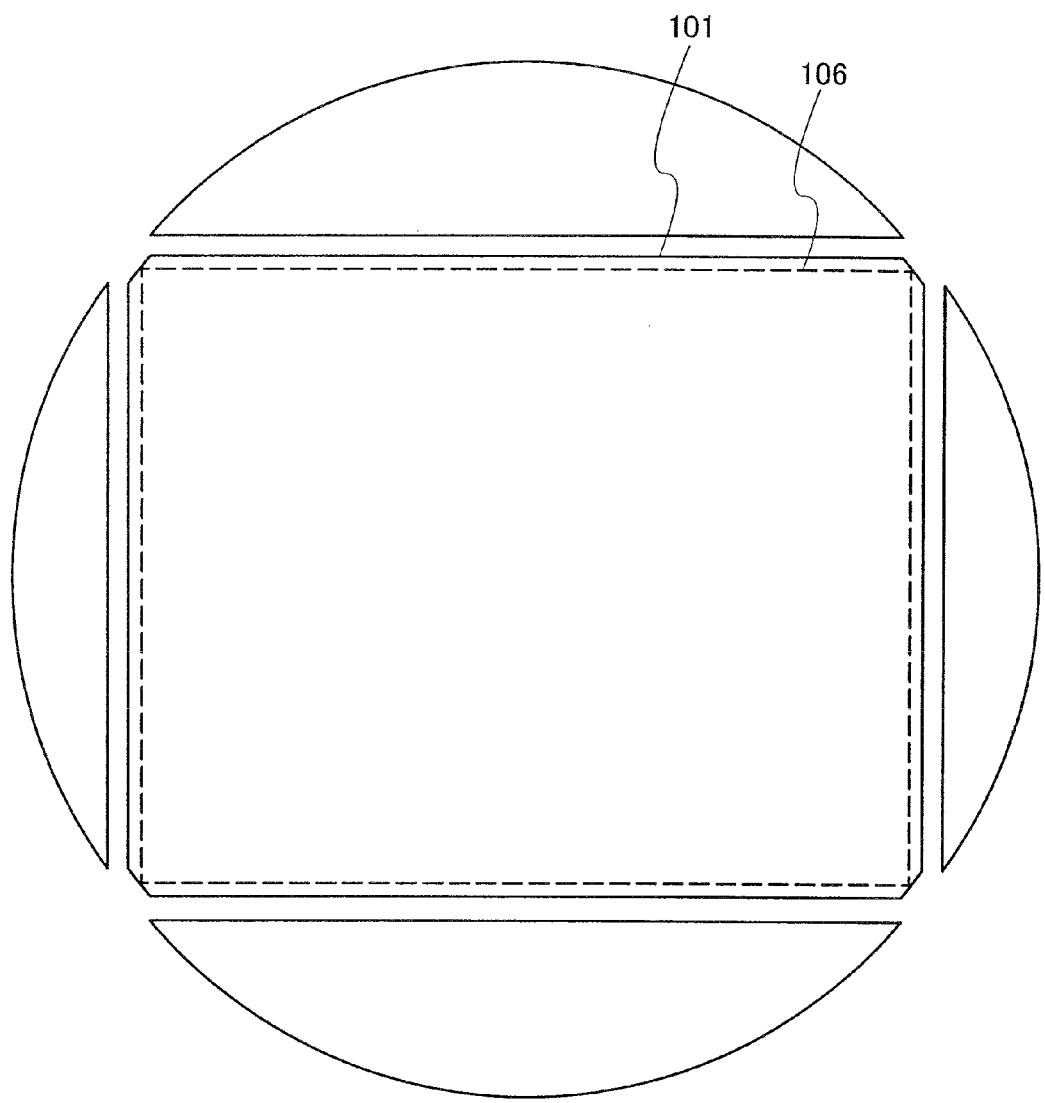
FIG. 5 shows an aspect in which a semiconductor substrate for transfer with a given outline dimension has been cut out from a substantially circular single crystal semiconductor substrate.

As shown in FIG. 5, the semiconductor substrate 101 for transfer is cut out with a distance between opposite sides longer than that in a rectangular region inscribed. That is, the semiconductor substrate 101 for transfer can be cut out so as not to make vertexes of the rectangle 90° by cutting along the cutoff lines 102 and 103. Through such processing, an area required for manufacturing a display panel can be secured in the semiconductor substrate 101 for transfer and a substrate whose angle portions are not acute angles of 90° can be manufactured. Since the angle portion of the semiconductor substrate 101 for transfer is not substantially right angle, the substrate can be prevented from being damaged when it is handled. Also as described in FIG. 3B, it is preferable that the peripheral end portion of the semiconductor substrate 101 for transfer be chamfered by shaving a sharp angle so as to be processed into a shape with a curved surface or a shape with an angle in multi-steps. This can reduce waste of silicon resources by preventing damage of the substrate. Note that mill ends after cutting-out can be reused by being melted. Further, the mill ends can also be used when a small single crystal semiconductor layer is formed.

(Use Efficiency of a Single Crystal Semiconductor Substrate)

In order to efficiently utilize the substantially circular single crystal semiconductor substrate 100, typically a silicon wafer, the outline dimension of the wafer and the dimension of the semiconductor substrate 101 for transfer to be cut out from the wafer are necessary to be considered. This is because, even when a large glass substrate is used, the number of panels to be obtained cannot be maximized as long as the size of the semiconductor substrate 101 for transfer does not fit the outer size of a display panel.

The outline dimension of the display panel is determined in accordance with the size of a screen and a peripheral region (also referred to as a frame region) accompanied with the screen. The peripheral region accompanied includes an area required for formation of an input/output terminal of signals, an area required for formation of a driver circuit, and the like.

The size of a glass substrate used for manufacturing a display panel varies depending on specification of a production line of a display panel, and a generation: 3rd generation (550 mm×650 mm), 3.5th generation (600 mm×720 mm or 620 mm×750 mm), 4th generation (680×880 mm or 730 mm×920 mm), 5th generation (1100 mm×1300 mm), 6th generation (1500 mm×1850 mm), 7th generation (1870 mm×2200 mm), 8th generation (2200×2400 mm), 9th generation (2400 mm×2800 mm or 2450 mm×3050 mm), and 10th generation (2950 mm×3400 mm).

Here, a relation between the size of a display panel and the use efficiency of a silicon wafer is shown in TABLE 1 in the case where a glass substrate in the 3.5th generation to the 4th generation is employed. Note that the use efficiency of a wafer shows a value on percentage obtained by dividing the area of a semiconductor substrate for transfer by the area of a silicon wafer.

Moreover, in the case of a glass substrate of 730 mm×920 mm, six semiconductor substrates of 335 mm×300 mm for transfer can be attached, and six 15-inch display panels can be obtained. When this is applied to the case of an 11.5-inch panel, 12 panels can be obtained from one glass substrate. At that time, the use efficiency of a wafer can be 63% or more.

In this manner, by using a silicon wafer with large diameter, a medium-sized panel that can be used for a monitor of a computer or the like, a portable television, or the like can be manufactured with high productivity while a silicon wafer is effectively utilized.

On the other hand, in the case of a small-sized panel of 10 inch or less in screen size, by attaching four semiconductor

TABLE 1

| | glass substrate (mm) | semiconductor substrate for transfer (mm) | the number of semiconductor substrate for transfer obtained from wafer ※1 | the use efficiency of a wafer ※1 | the number of tiles | 15 inch 253 × 317 (4:3) | | 11.5 inch 160 × 265 (16:9) | | 7 inch 98 × 162 (16:9) | | 3.7 inch 86 × 62 (4:3) | | 2.4 inch 58 × 43 (4:3) | |
|---|---|---|---|---|---|---|---|---|---|---|---|---|---|---|---|
| <1> | 600 × 720 | 126 × 126 | 6 | 59.9% | 20 | — | — | — | — | — | — | 1 | 20 | 4 | 80 |
| | | 200 × 200 | 2 | 50.3% | 9 | — | — | — | — | 2 | 18 | 6 | 54 | 12 | 108 |
| | | 195 × 225 | 2 | 55.2% | 9 | — | — | — | — | 2 | 18 | 6 | 54 | 12 | 108 |
| | | 300 × 300 | 1 | 56.6% | 4 | — | — | 1 | 4 | 3 | 12 | 12 | 48 | 35 | 140 |
| | | 280 × 350 | 1 | 61.6% | 4 | 1 | 4 | 2 | 8 | 4 | 16 | 16 | 64 | 36 | 144 |
| <2> | 620 × 750 | 205 × 205 | 2 | 52.9% | 9 | — | — | — | — | 2 | 18 | 6 | 54 | 12 | 108 |
| | | 205 × 219 | 2 | 56.5% | 9 | — | — | — | — | 2 | 18 | 6 | 54 | 15 | 135 |
| | | 200 × 223 | 2 | 56.1% | 9 | — | — | — | — | 2 | 18 | 6 | 54 | 15 | 135 |
| | | 310 × 250 | 1 | 48.8% | 6 | 1 | 6 | 1 | 6 | 3 | 18 | 9 | 54 | 25 | 150 |
| | | 280 × 350 | 1 | 61.6% | 4 | 1 | 4 | 2 | 8 | 4 | 16 | 16 | 64 | 36 | 144 |
| <3> | 730 × 920 | 212 × 212 | 2 | 56.5% | 12 | — | — | — | — | — | — | 6 | 72 | 12 | 144 |
| | | 182 × 230 | 2 | 52.7% | 16 | — | — | — | — | 2 | 32 | 6 | 96 | 15 | 240 |
| | | 335 × 300 | 1 | 63.2% | 6 | 1 | 6 | 2 | 12 | 6 | 36 | 15 | 90 | 35 | 210 |
| | | 350 × 270 | 1 | 59.4% | 6 | 1 | 6 | 2 | 12 | 4 | 24 | 16 | 96 | 36 | 216 |
| | | 365 × 230 | 1 | 52.8% | 8 | — | — | 1 | 8 | 4 | 32 | 12 | 96 | 30 | 240 |
| | | | | | | ↑※2 | | ↑※3 | | | | | | | |

※1 wafer size is 450 mm in diameter
※2 left column is the number of panels to be obtained from a semiconductor substrate for transfer
※3 right column is the number of panels to be obtained from a glass substrate In TABLE 1, a raw of <1> shows a relation between the size of a semiconductor substrate for transfer that can be obtained from a silicon wafer (18-inch silicon wafer) of 450 mm in diameter, and the use efficiency of a wafer in the case where a glass substrate of 600 mm×720 mm is used. In TABLE 1, the number of display panels to be obtained in each case of 15-inch screen, 11.5-inch screen, 7-inch screen, 3.7-inch screen, and 2.4-inch screen is shown in the right hand. Moreover, a raw of <2> and a raw of <3> show the case of a glass substrate of 620 mm×750 mm and the case of a glass substrate of 730 mm×920 mm, respectively.

TABLE 1 shows that the number of display panels in various generations and the use efficiency of a wafer differ depending on the size of a semiconductor substrate for transfer. In that case, the larger number of display panels obtained and higher use efficiency of a wafer may be an index showing high productivity and effective utilization of resources.

A matter that attracts attention here is that a 15-inch display panel can be formed by using a transistor formed of single crystal silicon with the use of a silicon wafer of 450 mm in diameter. For example, four semiconductor substrates of 280 mm×350 mm for transfer can be attached to a glass substrate of 600 mm×720 mm by using a silicon wafer of 450 mm in diameter. Accordingly, four 15-inch display panels can be obtained from one glass substrate. When this is applied to the case of an 11.5-inch panel, eight panels can be obtained from one glass substrate. At that time, the use efficiency of a wafer can be 60% or more.

substrates of 280 mm×350 mm to a glass substrates of 600 mm×720 mm, 16 panels in the conversion to 7-inch display panel, 64 panels in the conversion to 3.7-inch display panel, or 144 panels in the conversion to 2.4-inch display panel can be manufactured. That is, 10 or more display panels having a screen size of 2 to 7 inch can be obtained. It is needless to say that miniaturization is possible by using single crystal silicon. Accordingly, the density of pixels can be grown even in a display panel of 10 inch or less, so that images with high definition can be displayed.

As seen in the result shown in TABLE 1, by using a glass substrate of 600 mm×720 mm, in production of so-called small or medium sized panels of 2.4 to 15 inch display panels, the number of panels to be obtained can be maximized with a use efficiency of a wafer of 60% or more. In addition, in the case of a glass substrate of 620 mm×750 mm, the number of panels to be obtained can be maximized with a use efficiency of a wafer of 55% or more. Further, in the case of a glass substrate of 730 mm×920 mm, the number of panels to be obtained can be maximized with a use efficiency of a wafer of 52% or more.

(The Number of Single Crystal Semiconductor Layers Transferable to a Supporting Substrate)

As described in embodiment modes above, when a semiconductor substrate for transfer is cut out from a substantially circular single crystal semiconductor substrate, and the single crystal semiconductor layer is transferred on a mother glass substrate, the number of panels to be obtained cannot be maximized as long as the size of the semiconductor substrate 101 for transfer does not fit the outer size of a display panel. In this embodiment mode, a relation between a semiconductor substrate for transfer and a mother glass substrate will be illustrated.

Figure 6A:
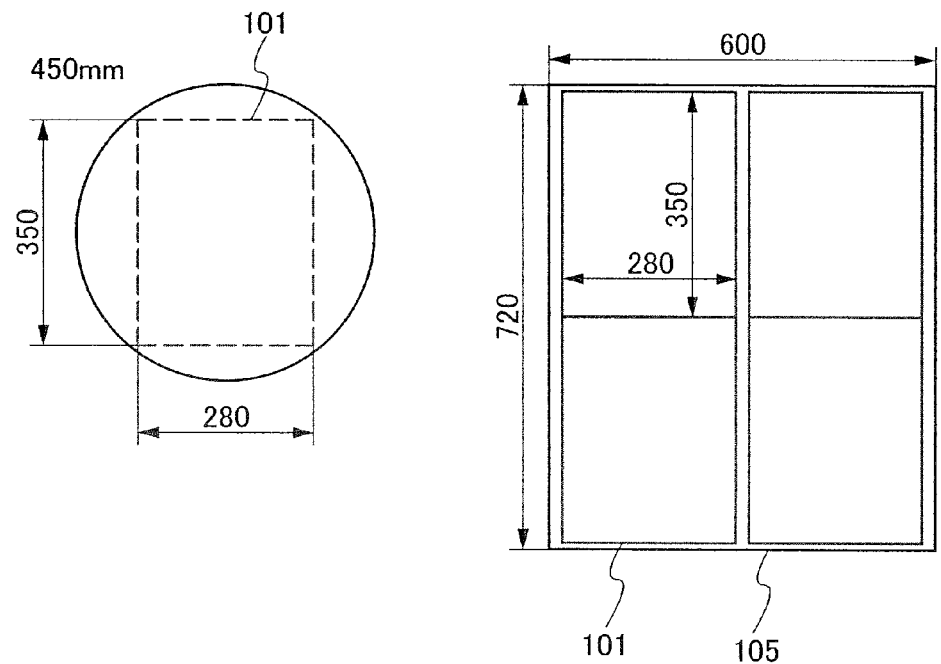
FIGS. 6A and 6B each show an aspect in which a semiconductor substrate for transfer is cut out from a silicon wafer of 450 mm in diameter and transferred on a supporting substrate of 600 mm×720 mm.
Figure 6B:
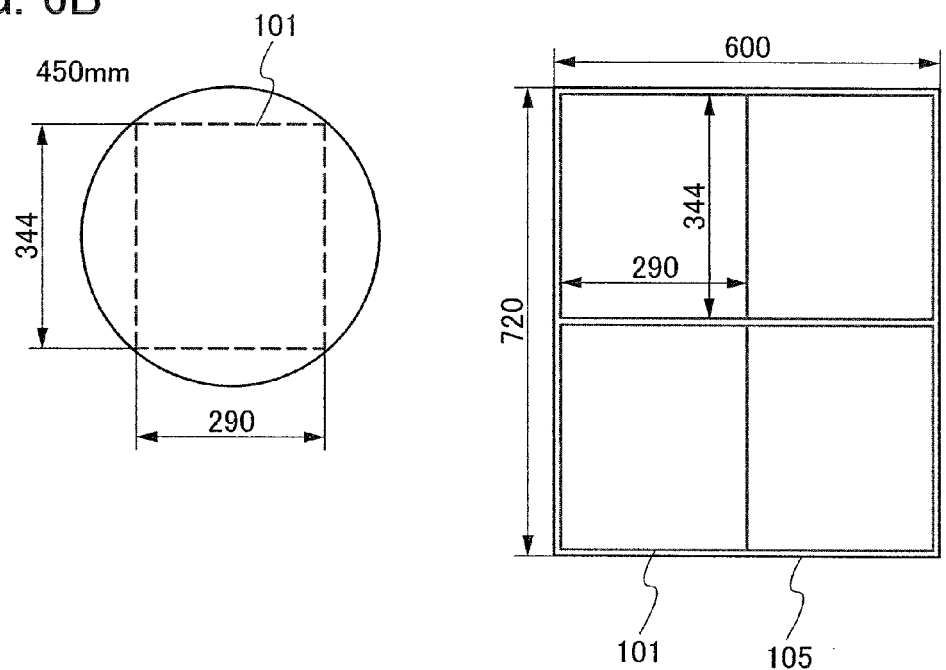

In FIG. 6A, one semiconductor substrate 101 of 280 mm×350 mm for transfer can be obtained from a silicon wafer of 450 mm in diameter, and four semiconductor substrates 101 for transfer can be attached to a supporting substrate 105 (for example, glass substrate) of 600 mm×720 mm. In FIG. 6B, one semiconductor substrate 101 of 290 mm×344 mm for transfer can be obtained from a silicon wafer of 450 mm in diameter, and four semiconductor substrates 101 can be attached to the supporting substrate 105 of 600 mm×720 mm. In the semiconductor substrate 101 of 280 mm×350 mm or 290 mm×344 mm for transfer, one display panel with a screen size of 15 inch can be manufactured.

Figure 7A:
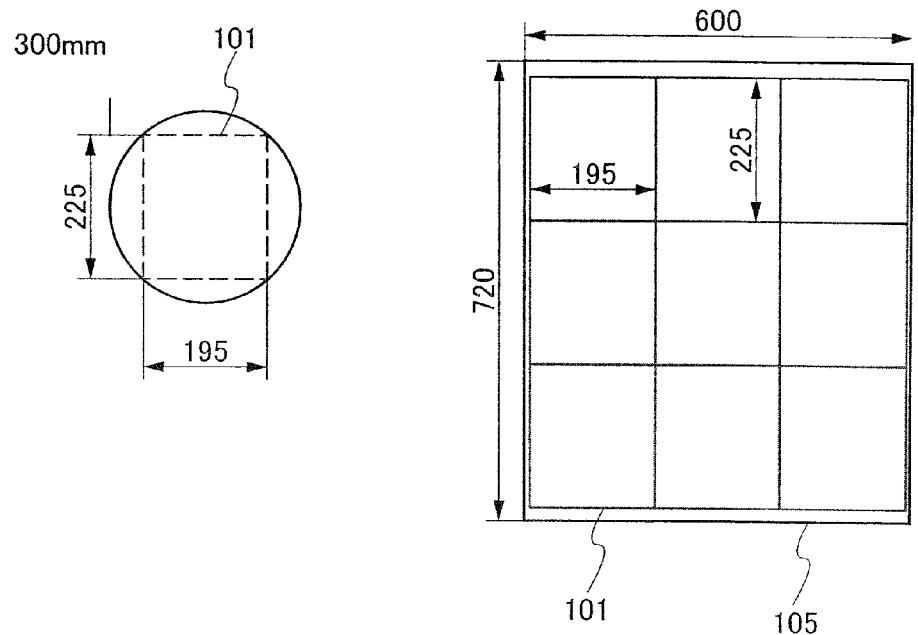
FIGS. 7A and 7B each show an aspect in which a semiconductor substrate for transfer is cut out from a silicon wafer of 200 mm or 300 mm in diameter and transferred on a supporting substrate of 600 mm×720 mm.
Figure 7B:
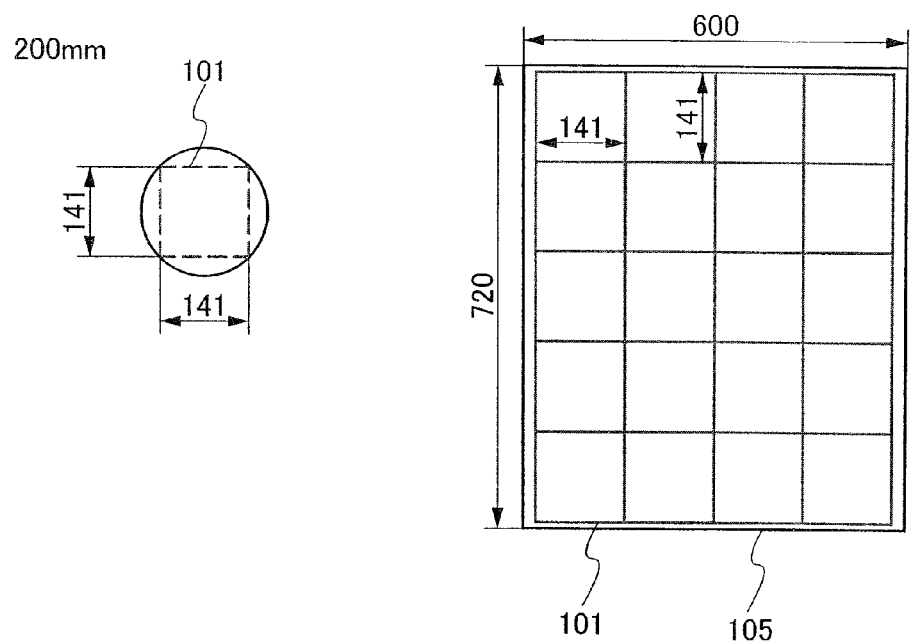

In FIG. 7A, one semiconductor substrate 101 of 195 mm×225 mm for transfer can be obtained from a silicon wafer of 300 mm in diameter, and nine semiconductor substrates 101 for transfer can be attached to the supporting substrate 105 (for example, glass substrate) of 600 mm×720 mm. In FIG. 7B, one semiconductor substrate 101 of 141 mm×141 mm for transfer can be obtained from a silicon wafer of 200 mm in diameter, and 20 semiconductor substrates 101 for transfer can be attached to the supporting substrate 105 of 600 mm×720 mm. In the semiconductor substrate 101 of 195 mm×225 mm for transfer, two display panels with a screen size of 7 inch can be manufactured, and 18 display panels with a screen size of 7 inch can be manufactured from the supporting substrate 105. Also in the semiconductor substrate 101 of 195 mm×225 mm for transfer, six display panels with a screen size of 3.7 inch can be manufactured, and 54 display panels with a screen size of 3.7 inch can be manufactured from the supporting substrate 105. Further in the semiconductor substrate 101 of 195 mm×225 mm for transfer, 12 display panels with a screen size of 2.4 inch can be manufactured, 108 display panels with a screen size of 2.4 inch can be manufactured from the supporting substrate 105.

Figure 8A:
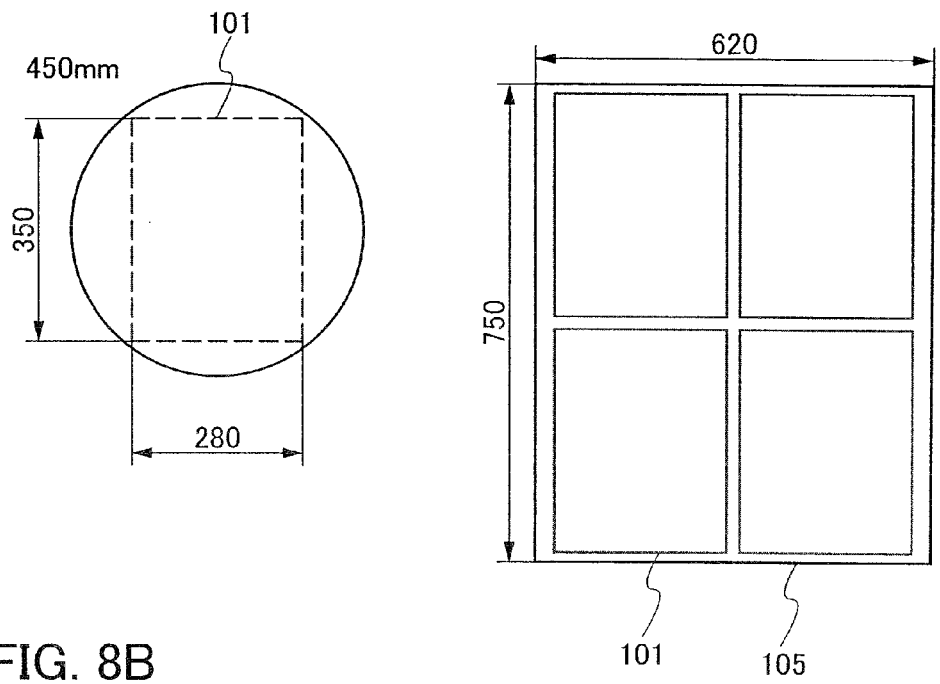
FIGS. 8A and 8B each show an aspect in which a semiconductor substrate for transfer is cut out from a silicon wafer of 450 mm in diameter and transferred on a supporting substrate of 620 mm×750 mm.
Figure 8B:
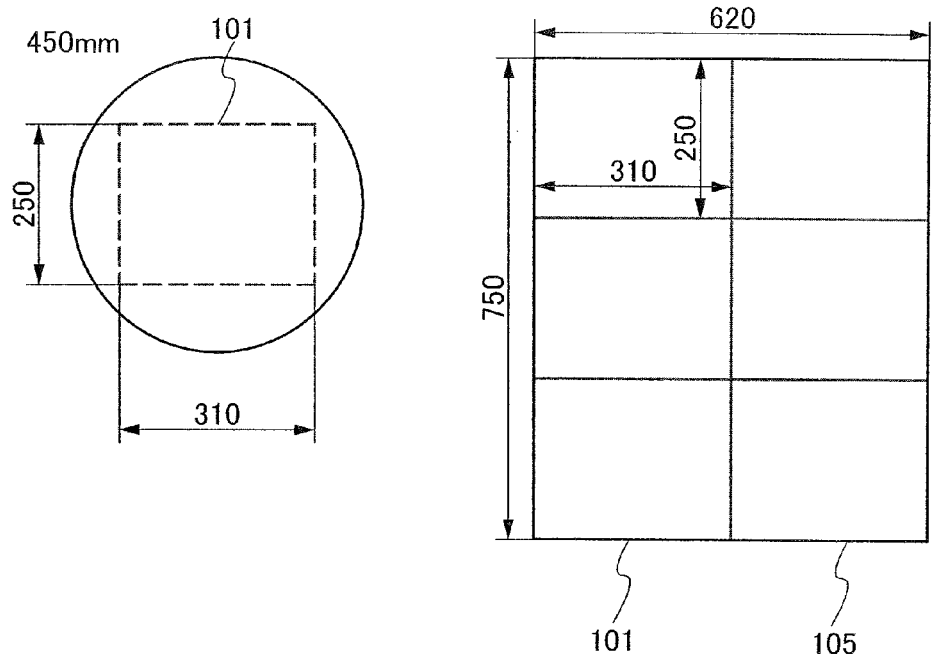

In FIG. 8A, one semiconductor substrate 101 of 280 mm×350 mm for transfer can be obtained from a silicon wafer of 450 mm in diameter, and four semiconductor substrates 101 for transfer can be attached to the supporting substrate 105 (for example, glass substrate) of 620 mm×750 mm. In FIG. 8B, one semiconductor substrate 101 of 310 mm×250 mm for transfer can be obtained from a silicon wafer of 450 mm in diameter, and six semiconductor substrates 101 for transfer can be attached to the supporting substrate 105 of 620 mm×750 mm. In the semiconductor substrate 101 of 280 mm×350 mm for transfer, one display panel with a screen size of 15 inch can be manufactured, and four display panels with a screen size of 15 inch can be manufactured from the supporting substrate 105. In the semiconductor substrate 101 of 310 mm×250 mm for transfer, one display panel with a screen size of 15 inch can be manufactured, and six display panels with a screen size of 15 inch can be manufactured from the supporting substrate 105.

Figure 9A:
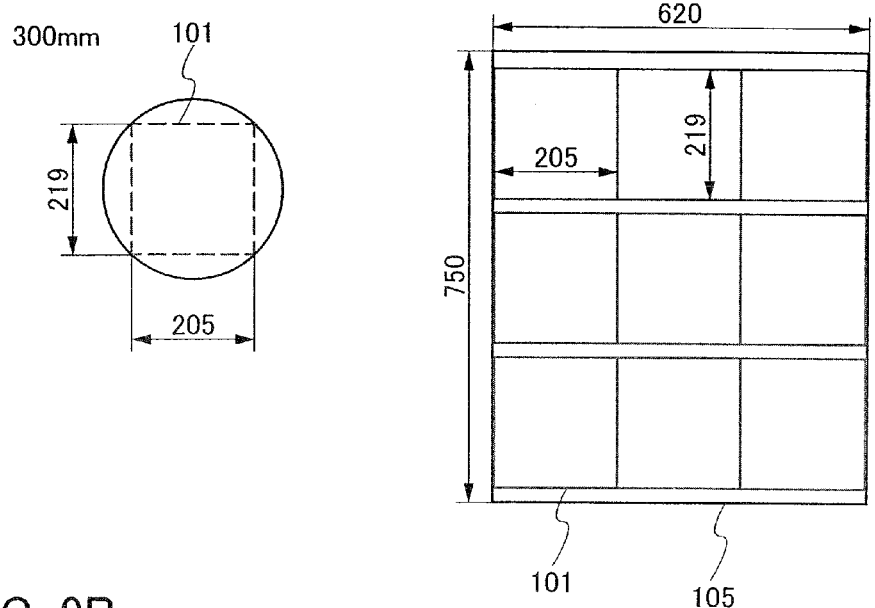
FIGS. 9A and 9B each show an aspect in which a semiconductor substrate for transfer is cut out from a silicon wafer of 300 mm in diameter and transferred on a supporting substrate of 620 mm×750 mm.
Figure 9B:
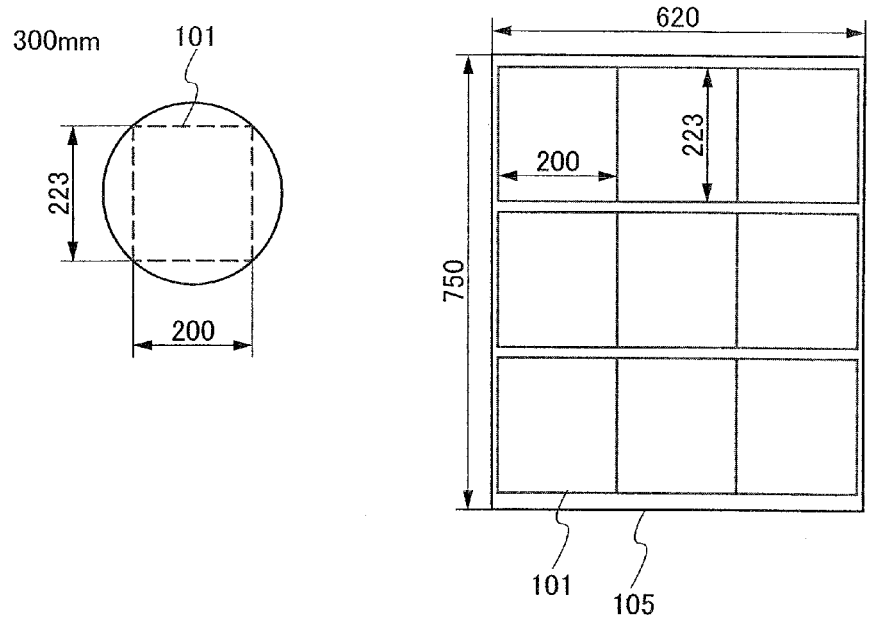

In FIG. 9A, one semiconductor substrate 101 of 205 mm×219 mm for transfer can be obtained from a silicon wafer of 300 mm in diameter, and nine semiconductor substrates 101 for transfer can be attached to the supporting substrate 105 (for example, glass substrate) of 620 mm×750 mm. In FIG. 9B, one semiconductor substrate 101 of 200 mm×223 mm for transfer can be obtained from a silicon wafer of 300 mm in diameter, and nine semiconductor substrates 101 for transfer can be attached to the supporting substrate 105 of 620 mm×750 mm. In the semiconductor substrate 101 of 205 mm×219 mm or 200 mm×223 mm for transfer, two display panels with a screen size of 7 inch can be manufactured, and 18 display panels with a screen size of 7 inch can be manufactured from the supporting substrate 105. Also in the semiconductor substrate 101 of 205 mm×219 mm or 200 mm×223 mm for transfer, six display panels with a screen size of 3.7 inch can be manufactured, and 54 display panels with a screen size of 3.7 inch can be manufactured from the supporting substrate 105. Further in the semiconductor substrate 101 of 205 mm×219 mm or 200 mm×223 mm for transfer, 15 display panels with a screen size of 2.4 inch can be manufactured, and 135 display panels with a screen size of 2.4 inch can be manufactured from the supporting substrate 105.

In FIG. 10A, one semiconductor substrate 101 of 280 mm×350 mm for transfer can be obtained from a silicon wafer of 450 mm in diameter, and six semiconductor substrates 101 for transfer can be attached to the supporting substrate 105 (for example, glass substrate) of 730 mm×920 mm. In FIG. 10B, one semiconductor substrate 101 of 365 mm×230 mm for transfer can be obtained from a silicon wafer of 450 mm in diameter, and eight semiconductor substrates 101 for transfer can be attached to the supporting substrate 105 of 730 mm×920 mm. In the semiconductor substrate 101 of 280 mm×350 mm for transfer, one display panel with a screen size of 15 inch can be manufactured, and six display panels with a screen size of 15 inch can be manufactured from the supporting substrate 105. Also in the semiconductor substrate 101 of 280 mm×350 mm for transfer, 36 display panels with a screen size of 2.4 inch can be manufactured, and 216 display panels with a screen size of 2.4 inch can be manufactured from the supporting substrate 105. Further in the semiconductor substrate 101 of 365 mm×230 mm for transfer, 30 display panels with a screen size of 2.4 inch can be manufactured, and 240 display panels with a screen size of 2.4 inch can be manufactured from the supporting substrate 105.

In FIG. 11A, one semiconductor substrate 101 of 212 mm×212 mm for transfer can be obtained from a silicon wafer of 300 mm in diameter, and 12 semiconductor substrates 101 for transfer can be attached to the supporting substrate 105 (for example, glass substrate) of 730 mm×920 mm. In FIG. 11B, one semiconductor substrate 101 of 182 mm×230 mm for transfer can be obtained from a silicon wafer of 300 mm in diameter, and 16 semiconductor substrates 101 for transfer can be attached to the supporting substrate 105 of 730 mm×920 mm. In the semiconductor substrate 101 of 212 mm×212 mm for transfer, six display panels with a screen size of 3.7 inch can be manufactured, and 72 display panels with a screen size of 3.7 inch can be manufactured from the supporting substrate 105. Also in the semiconductor substrate 101 of 212 mm×212 mm for transfer, 12 display panels with a screen size of 2.4 inch can be manufactured, and 144 display panels with a screen size of 2.4 inch can be manufactured from the supporting substrate 105. Further in the semiconductor substrate 101 of 182 mm×230 mm for transfer, six display panels with a screen size of 3.7 inch can be manufactured, and 96 display panels with a screen size of 3.7 inch can be manufactured from the supporting substrate 105. Furthermore in the semiconductor substrate 101 of 182 mm×230 mm for transfer, 15 display panels with a screen size of 2.4 inch can be manufactured, and 240 display panels with a screen size of 2.4 inch can be manufactured from the supporting substrate 105.

In this manner, by manufacturing a semiconductor substrate of a given size for transfer with the use of a single crystal semiconductor substrate (silicon wafer) of 300 mm or more in diameter, and forming a single crystal semiconductor layer by arranging a plurality of semiconductor substrates for transfer on a supporting substrate (glass substrate) of 500 mm or more in one side, from a panel with a small-sized screen of 2.4 inch to a panel with a medium-sized screen of 15 inch can be manufactured with high productivity.

(Formation of a Single Crystal Semiconductor Layer Over a Supporting Substrate)

A semiconductor substrate for transfer in which a damaged layer is formed at a region in 1 μm or less, preferably 50 nm to 150 nm, from its surface is bonded to a supporting substrate. By cleaving the damage layer or the vicinity thereof, a single crystal semiconductor layer is formed over the supporting substrate.

Figure 12:
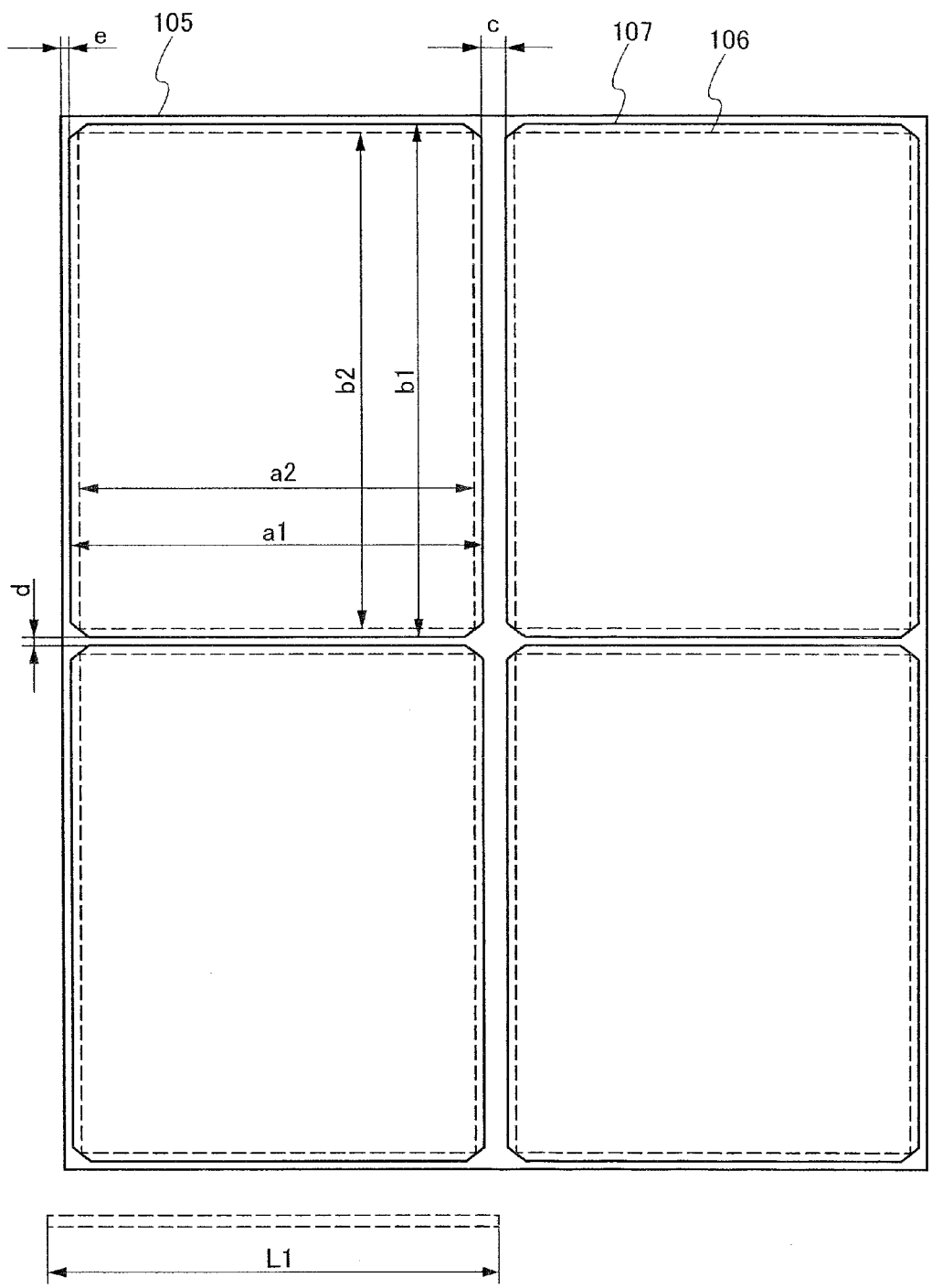
FIG. 12 shows an example of an arrangement in providing a single crystal silicon semiconductor layer over a supporting substrate.

FIG. 12 shows one example of arrangement when a single crystal semiconductor layer 107 is formed over the supporting substrate 105. The single crystal semiconductor layer 107 is cut out from a substantially circular semiconductor substrate so as to be a1×b1 in size and have its vertex at an angle of 90° or less. A region a2×b2 in size inside the single crystal semiconductor layer 107 is used as a panel effective-utilization region 106. Each pattern of a display panel is transferred to the panel effective-utilization region 106 by a photolithography technique. By imaginarily providing the panel effective-utilization region 106 inside the single crystal semiconductor layer 107, manufacturing yield can be improved. This is because, even if an end portion of the single crystal semiconductor layer 107 has a defect, the panel effective-utilization region 106 can avoid being influenced by the defect.

In arrangement shown in FIG. 12, spaces between adjoining objects, that is, an adjacence space c and an adjacence space d are different. In arranging the single crystal semiconductor layer 107 over the supporting substrate 105, the adjacence space c which is in a shorter direction is wider than the adjacence space d which is in a longer direction and an end portion space e which is a space between an end portion of the single crystal semiconductor layer 107 and an end portion of the supporting substrate 105.

By setting such arrangement, in the case where the single crystal semiconductor layer 107 is recrystallized or its surface is processed by using a linear laser beam with a length of L1 in a longer direction, which is longer than a1 of the single crystal semiconductor layer 107 and shorter than a shorter side of the supporting substrate 105, an end portion of the linear laser beam can be set in the adjacence space c while the single crystal semiconductor layer 107 is irradiated with the linear laser beam. That prevents variations in quality because the adjoining single crystal semiconductor layers 107 are not irradiated also with the edge of the linear laser beam.

Figure 13:
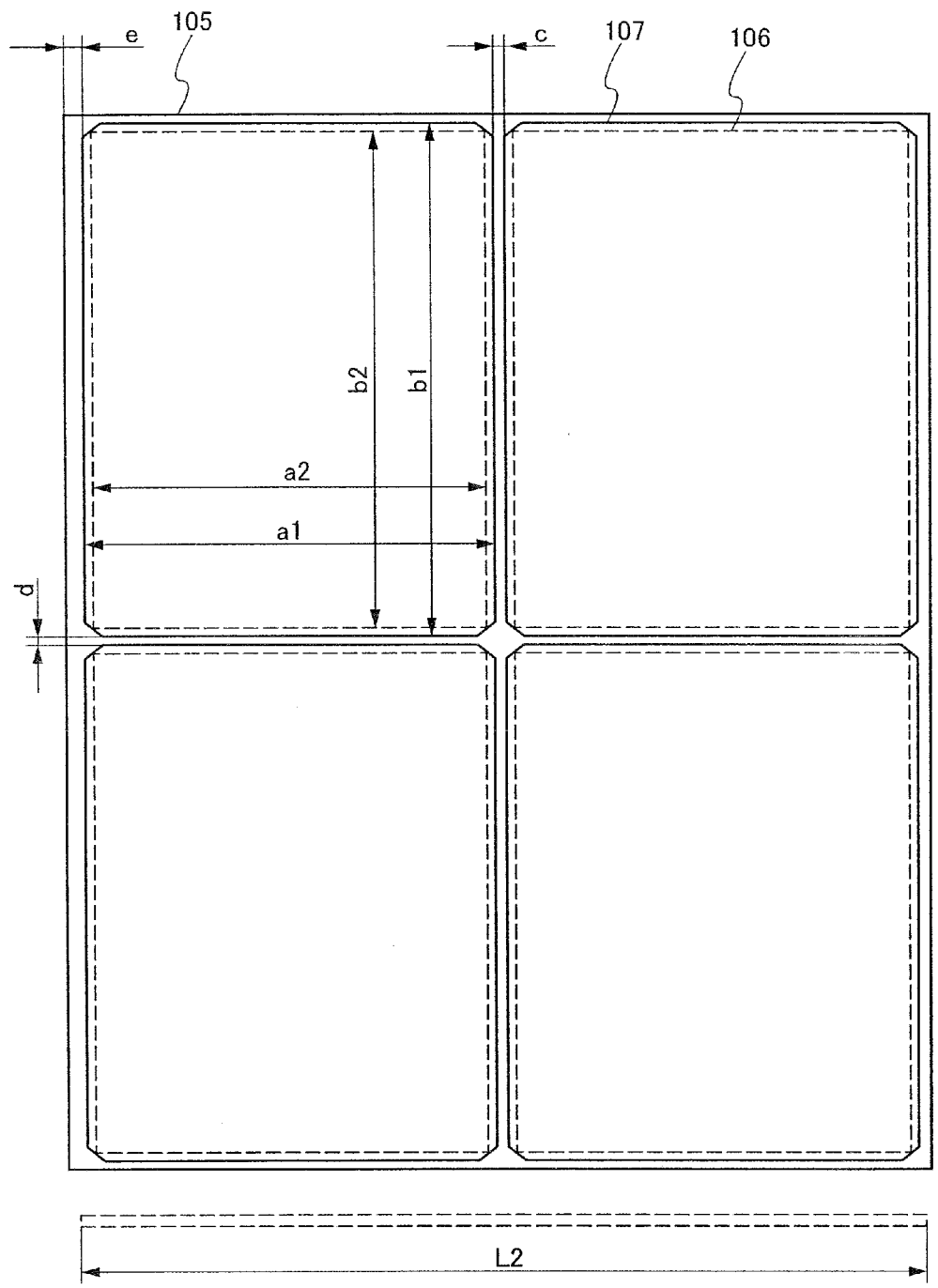
FIG. 13 shows an example of an arrangement in providing a single crystal silicon semiconductor layer over a supporting substrate.

FIG. 13 shows another aspect when four single crystal semiconductor layers 107 are provided over one supporting substrate 105. In arrangement shown in FIG. 13, spaces between adjoining objects, that is, an adjacence space c and an adjacence space d are the same or substantially the same and an end portion space e which is the space between an end portion of the single crystal semiconductor layer 107 and an end portion of the supporting substrate 105 is wider than each of the adjacence spaces c and d. Such arrangement of the single crystal semiconductor layer 107 is effective when the length L2, which is in a longer direction, of a linear laser beam is substantially the same as the length of one side of the supporting substrate 105, that is, the length L2 is long enough to process a plurality of arranged single crystal semiconductor layers 107 at the same time.

(Step for Transferring a Single Crystal Semiconductor Layer to a Supporting Substrate—1)

Next, a method for forming a single crystal semiconductor layer over a supporting substrate will be described with reference to FIGS. 14A to 14C and FIGS. 15A and 15B.

Figure 14A:
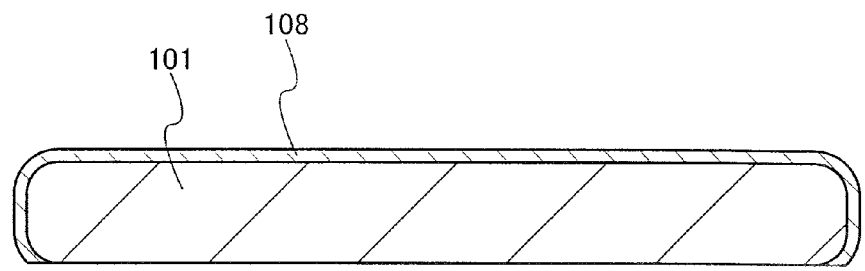
FIGS. 14A to 14C are cross-sectional views of steps of forming a single crystal semiconductor layer over a supporting substrate.

As shown in FIG. 14A, a first insulating layer 108 is formed over a semiconductor substrate 101 for transfer. As a material for the semiconductor substrate 101 for transfer, single crystal silicon, polycrystalline silicon, or the like is employed. As the semiconductor substrate 101 for transfer, for example, the one cut out from a 300 mm silicon wafer (12-inch wafer) or a 450 mm silicon wafer (18-inch silicon wafer) is preferably employed. A semiconductor substrate whose planar shape is substantially quadrangle and a space between opposite sides are 280 mm×350 mm, 335 mm×300 mm, 350 mm×270 mm, or the like in outline dimension can be used as the semiconductor substrate 101 for transfer as appropriate. By using a substantially quadrangle semiconductor substrate as the semiconductor substrate 101 for transfer, the semiconductor substrates 101 for transfer can be densely arranged over a rectangular supporting substrate such as a mother glass substrate.

The first insulating layer 108 is formed of an insulating material such as silicon nitride oxide or silicon nitride. The first insulating layer 108 is preferably provided in order to prevent a single crystal semiconductor layer from being contaminated by impurities from a supporting substrate side when part of the semiconductor substrate 101 for transfer is bonded to the supporting substrate later to form the single crystal semiconductor layer. That is, the first insulating layer 108 functions as a barrier layer for preventing impurities such as mobile ions or moisture contained in the supporting substrate from diffusing into the single crystal semiconductor layer. Accordingly, when contamination by impurities is not a problem, the first insulating layer 108 containing nitrogen may be omitted.

The first insulating layer 108 is formed to have a single layer structure or a stacked layer structure using a silicon nitride layer, a silicon nitride oxide layer, or a silicon oxynitride layer by plasma CVD, sputtering, or the like. The first insulating layer 108 is preferably formed to a thickness of 50 to 200 nm. For example, a silicon oxynitride layer and a silicon nitride oxide layer are stacked from the side of the semiconductor substrate 101 for transfer, so that the first insulating layer 108 can be obtained.

Note that a silicon oxynitride film refers to a film which contains more oxygen than nitrogen and contains oxygen, nitrogen, silicon, and hydrogen at concentrations ranging from 55 to 65 at. %, 1.0 to 20 at. %, 25 to 35 at. %, and 0.1 to 10 at. %, respectively. Further, a silicon nitride oxide film refers to a film which contains more nitrogen than oxygen and contains oxygen, nitrogen, silicon, and hydrogen at concentrations ranging from 15 to 30 at. %, 20 to 50 at. %, 25 to 35 at. %, and 15 to 25 at. %, respectively.

The first insulating layer 108 may be formed using a combination of layers formed of the above-described materials or insulating materials having different physical properties. For example, a silicon nitride layer and a silicon oxide layer may be stacked from the side of the semiconductor substrate 101 for transfer. In the case where the first insulating layer 108 is formed using a plurality of insulating layers, every time after formation of a layer, treatment for removing powders which adhere to a surface of a film is preferably performed by pure water ultrasonic cleaning of 50 kHz to 5 MHz or two fluid cleaning with pure water and nitrogen or dry air. In that case, cleaning effect can be further enhanced by intentionally adding $CO_2$ or the like to the pure water to decrease resistivity to 0.5 to 5 MΩcm and prevent electrification with static electricity.

Figure 14B:
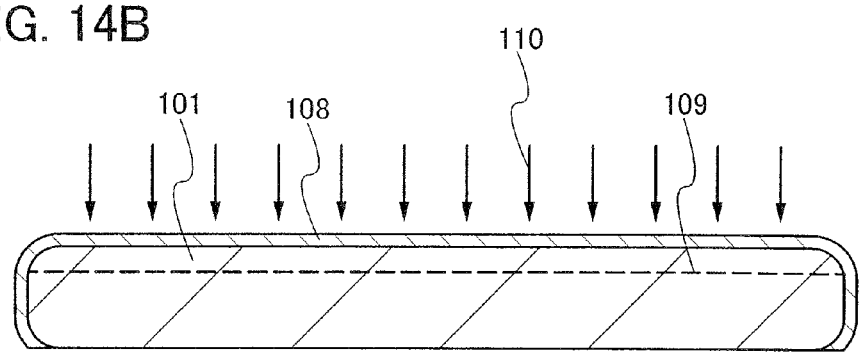

Next, as shown in FIG. 14B, cluster ions typified by hydrogen ions, preferably $H_3^+$, are introduced to the semiconductor substrate 101 for transfer to form a damaged layer 109 in a region in a certain depth from a surface. The depth in which the damaged layer 109 is formed is controlled by acceleration energy of ions. Depending on the depth in which the damaged layer 109 is formed, the thickness of the single crystal semiconductor layer to be separated from the semiconductor substrate 101 for transfer is determined. By controlling electric field strength for accelerating cluster ions, the thickness of the single crystal semiconductor layer to be separated from the semiconductor substrate 101 for transfer can be changed.

Cluster ions which are hydrogen ions and typified by $H_3^+$ can be added by using an ion doping apparatus that generates a hydrogen plasma and adds ions, without mass separation thereof generated in the hydrogen plasma, by accelerating the ions with electric field. By using the ion doping apparatus, ions can be easily added even in the case of the large semiconductor substrate 101 for transfer.

The cluster ions are typified by $H_3^+$ ions. For example, hydrogen is introduced to an ion source, pressure is set at approximately $1\times10^{-2}$ Pa, and electric power is applied to a filament to generate a plasma, whereby $H_3^+$ ions can be obtained. By generating the hydrogen plasma with the use of thermo electrons of the filament, the proportion of $H_3^+$ ions can be higher than that of other ion species ($H^+$, $H_2^+$), which is preferable. By implanting $H_3^+$ ions, the implantation efficiency of hydrogen atoms becomes higher than that in the case of $H^+$, $H_2^+$, so that hydrogen can be implanted at high concentration even if dosage is small. It is preferably that $H_3^+$ ions of 50% or more with respect to the total amount of ion species of $H^+$, $H_2^+$, and $H_3^+$ is contained in an ion beam 110. The proportion of $H_3^+$ ions are preferably 80% or more. By increasing the proportion of $H_3^+$, hydrogen of $1\times10^{20}$ atoms/$cm^3$ or more can be contained in the damaged layer 109.

Figure 19:
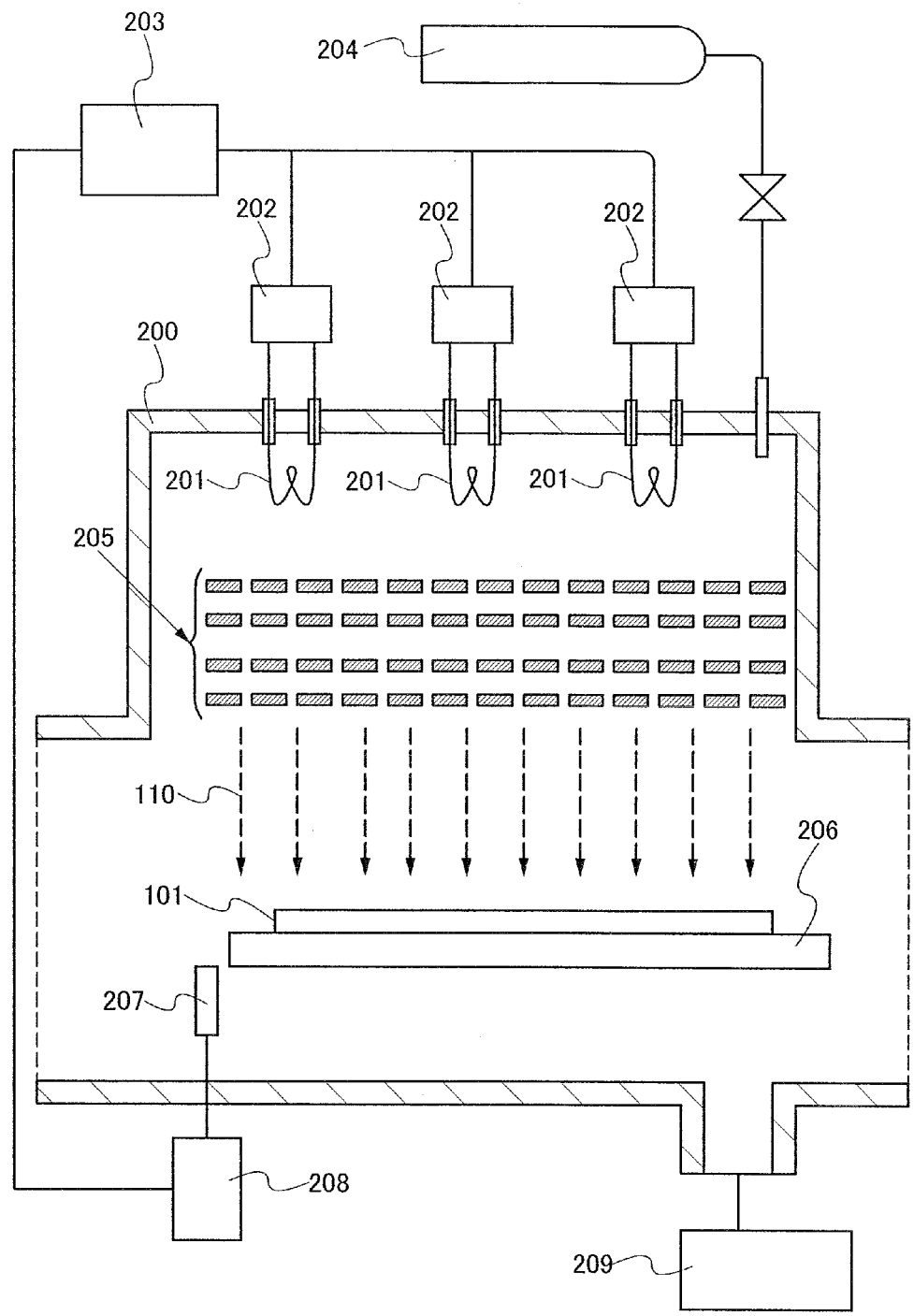
FIG. 19 is a schematic diagram for describing one structural example of an ion doping apparatus.

FIG. 19 is a schematic view for describing a structure of an ion doping apparatus that implants plural kinds of ions generated in an ion source 200 to the semiconductor substrate 101 for transfer without mass separation of the ions. A given gas such as hydrogen is supplied to the ion source 200 from a gas supply portion 204. The ion source 200 is provided with filaments 201. Filament power sources 202 apply arc discharge voltage to the filaments 201 and adjust current which flows through the filaments 201. A gas supplied from the gas supply portion 204 is exhausted through an exhaust system 209.

Ions generated in the ion source 200 are drawn by a drawing electrode system 205 and an ion beam 110 is formed. The semiconductor substrate 101 for transfer, which is placed on a mounting board 206, is irradiated with the ion beam 110. The proportion of ion species contained in the ion beam 110 is calculated by a mass analysis tube 207 which is provided near the mounting board 206. Ion density counted by the mass analysis tube 207 is converted into a signal by a mass analyzer 208 and a result thereof may be fed back to a power source controller 203. The power source controller 203 can control the filament power sources 202 in accordance with a result from counting ion density.

When the damaged layer 109 shown in FIG. 14B is formed by using such an ion doping apparatus, a crystal structure is impaired and microvoids are formed, that is, the damaged layer 109 has a porous structure. Therefore, the volume of microvoids formed in the damaged layer 109 is changed by thermal treatment at a relatively low temperature (600° C. or less), and the single crystal semiconductor layer 107 can be cleaved along the damaged layer 109.

The introduction of the cluster ions is performed in consideration of the thickness of the single crystal semiconductor layer which is separated from the semiconductor substrate 101 for transfer and transferred to the supporting substrate later. Preferably, the thickness of the single crystal semiconductor layer is set to 5 to 500 nm, more preferably, 10 to 200 nm. The accelerating voltage and the dosage of ions at the time of introduction of ions are determined as appropriate in consideration of the thickness of the single crystal semiconductor substrate to be transferred. In the case where $H_3^+$ ions are introduced as a main ion like in this embodiment mode, since the mass of the $H_3^+$ ion is larger than that of the $H^+$ ion, the damaged layer 109 can be formed in a region which is in a shallow level from the surface of the semiconductor substrate 101 for transfer. Accordingly, a polishing step such as a CMP process can be skipped because of this. In addition, since the cleavage surface is considerably flat, a flattening step by thermal treatment at a high temperature of more than 1000° C. is not necessary.

Figure 14C:
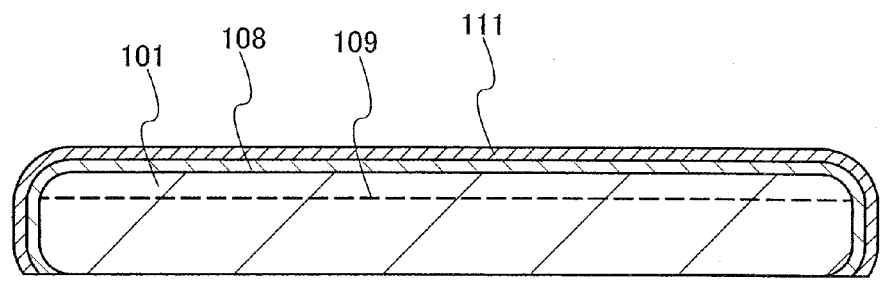

Next, as shown in FIG. 14C, a second insulating layer 111 is formed over the semiconductor substrate 101 for transfer with the first insulating layer 108 interposed therebetween. The second insulating layer 111 functions as a bonding layer of the supporting substrate and is provided on a surface where the semiconductor substrate 101 for transfer and the supporting substrate are bonded. As the second insulating layer 111, a single layer structure or a stacked layer structure may be employed; however, an insulating layer whose surface (hereinafter also referred to as a bonding surface) which is bonded to the supporting substrate is smooth and has a hydrophilic property is preferably used.

As an insulating layer whose surface can be smooth and have a hydrophilic property, silicon oxide containing hydrogen, silicon nitride containing hydrogen, silicon nitride containing oxygen and hydrogen, silicon oxynitride, silicon nitride oxide, or the like can be used.

As the silicon oxide containing hydrogen, for example, silicon oxide formed of organosilane by chemical vapor deposition can be used. This is because the second insulating layer 111 formed of organosilane, such as a silicon oxide film, can enhance bonding between the supporting substrate and the single crystal semiconductor layer. Examples of organosilane that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

The silicon nitride containing hydrogen can be formed using a silane gas and an ammonia gas by plasma CVD. Hydrogen may be added to the gases. The silicon nitride containing oxygen and hydrogen can be formed using a silane gas, ammonia gas, and a nitrous oxide gas by plasma CVD. In either case, silicon oxide, silicon oxynitride, or silicon nitride oxide, which contain hydrogen, formed using a silane gas or the like as a source gas by chemical vapor deposition such as plasma CVD, reduced pressure CVD, or atmosphere pressure CVD can be employed. Deposition by chemical vapor deposition is performed at a temperature low enough to keep from degassing of the damaged layer 109 formed in the semiconductor substrate 101 for transfer. For example, the deposition temperature is preferably less than or equal to 350° C. Note that as a temperature of heat treatment by which the single crystal semiconductor layer is separated from the semiconductor substrate 101 for transfer, a temperature is used which is higher than a temperature of deposition by chemical vapor deposition. In either case, an insulating layer whose surface is smooth and has hydroxyl can be used as the second insulating layer 111.

Figure 15A:
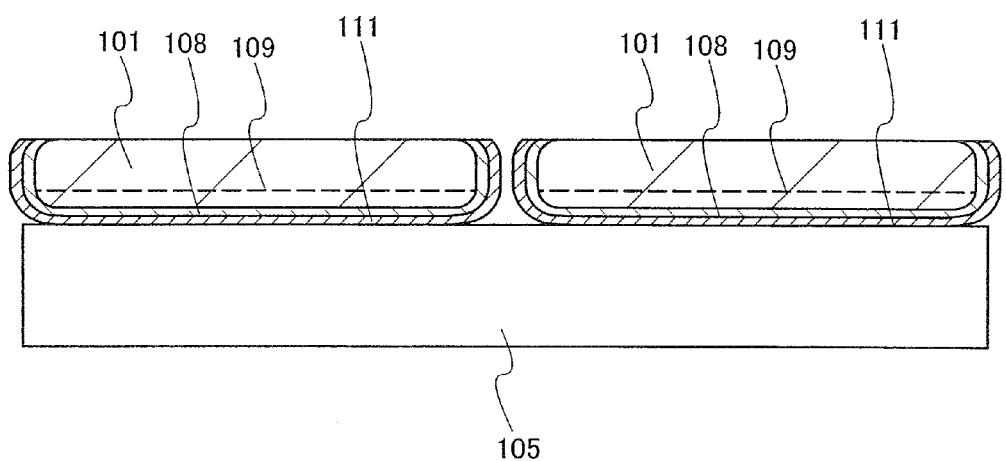
FIGS. 15A and 15B are cross-sectional views of steps of forming a single crystal semiconductor layer over a supporting substrate.

Next, as shown in FIG. 15A, the semiconductor substrate 101 for transfer and the supporting substrate 105 are bonded to each other. The surface of the second insulating layer 111 formed over the semiconductor substrate 101 for transfer and the surface of the supporting substrate 105 are attached to each other to be bonded. Hydrogen bond and Van del Waals force act on this bonding. When the hydrogen bond achieves bond, the surface of the substrate has a hydrophilic property, hydroxyl or water molecules serve as an adhesive agent, and the water molecules diffuse by thermal treatment, whereby remaining components form a silanol group (Si—OH). Further, this bonding portion comes to have a covalent bond due to loss of hydrogen and formation of siloxane bond (O—Si—O). Accordingly, the bond between the semiconductor substrate 101 for transfer and the supporting substrate 105 is enhanced.

A substrate having an insulating surface is used as the supporting substrate 105. For example, a variety of glass substrates that are used in the electronics industry, such as aluminosilicate glass, aluminoborosilicate glass, and barium borosilicate glass; quartz substrates; ceramic substrates; and sapphire substrates can be used. A glass substrate is preferably used as the supporting substrate 105; for example, a mother glass substrate for liquid crystals can be also used, such as a 3.5th generation substrate (600 mm×720 mm or 620×750) or a 4th generation substrate (680 mm×880 mm or 730 mm×920 mm). Alternatively, a large mother glass substrate can also be used, such as a so-called 6th generation substrate (1500 mm×1850 mm), 7th generation (1870 mm×2200 mm), or 8th generation substrate (2200 mm×2400 mm). By using the large mother glass substrate as the supporting substrate 105, the number of display panels which can be manufactured from one substrate (the number of chamfered panels) can be increased, whereby productivity is improved.

Among a variety of glass substrates that are used in the electronics industry, such as aluminosilicate glass, aluminoborosilicate glass, and barium borosilicate glass, the one having a polished surface is preferable because of considerable flatness. By bonding the polished surface of the glass substrate to a semiconductor wafer or the second insulating layer provided for the semiconductor wafer, a bonding defect can be suppressed. The glass substrate can be polished by, for example, cerium oxide or the like. After polishing, remaining abrasives is desirably removed by using a mixed solution of hydrochloric acid, hydroperoxide water, and water.

After the supporting substrate 105 and the semiconductor substrate 101 for transfer are bonded to each other with the second insulating layer 111 interposed therebetween, one of thermal treatment and pressure treatment or the both are performed. Thermal treatment or pressure treatment makes an increase in bonding strength between the supporting substrate 105 and the semiconductor substrate 101 for transfer possible. The thermal treatment is performed at a temperature equal to or lower than the upper temperature limit of the supporting substrate 105. The pressure treatment is performed so as to apply a pressure of approximately 1 to 2 atmospheric pressure in a direction perpendicular to the bonding surface. In the pressure treatment, the supporting substrate 105 and the semiconductor substrate 101 for transfer are kept in a pressure container while a given pressure is applied to it. Alternatively, the supporting substrate 105 and the semiconductor substrate 101 for transfer are interposed between pressing plates made of ceramics or the like and a force of 10 kN to 20 kN is applied thereto by mechanical act. In that case, by heating the supporting substrate 105 and the semiconductor substrate 101 for transfer at the same time as pressure, the bonding strength can be enhanced.

Figure 20A:
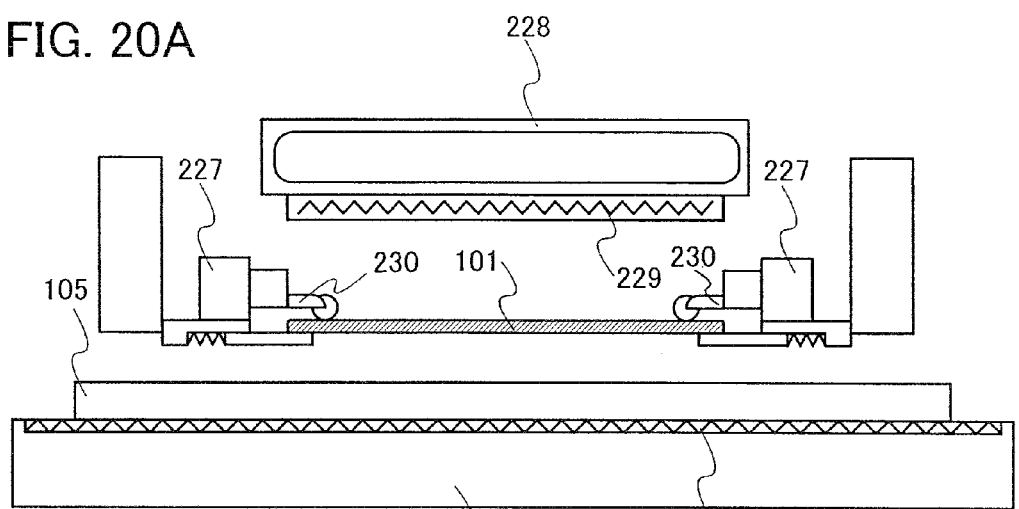
FIGS. 20A to 20C are schematic diagrams for describing one structural example of an apparatus for transferring a semiconductor substrate for transfer to a supporting substrate.
Figure 20B:
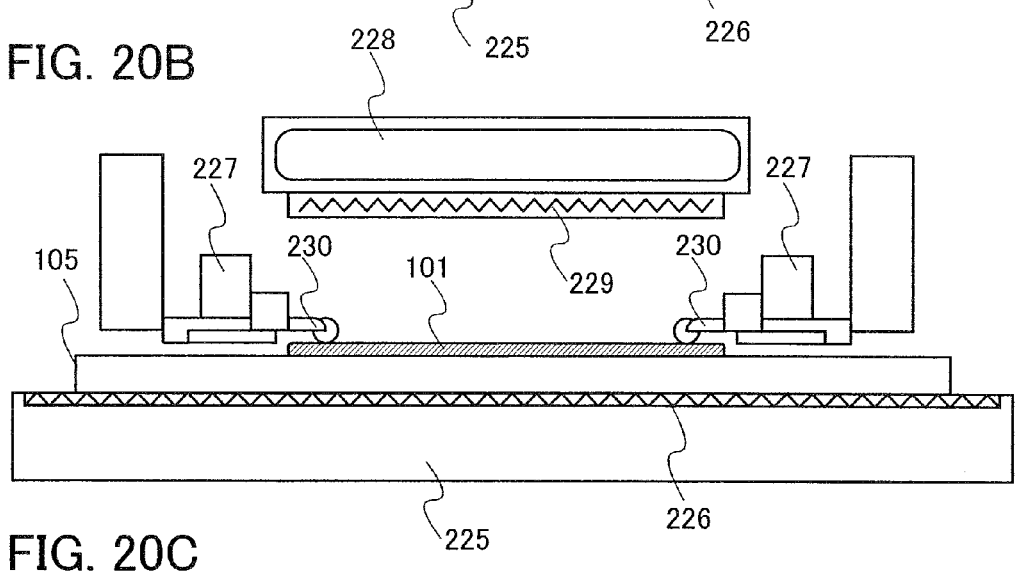
Figure 20C:
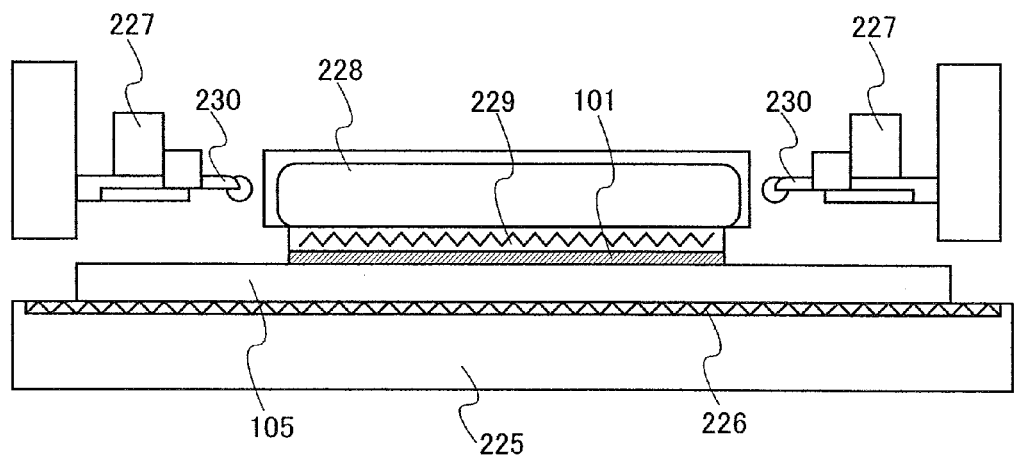

FIGS. 20A to 20C illustrate an example of an apparatus that transfers the semiconductor substrate 101 for transfer to the supporting substrate 105, and bond or provisionally bond these substrates to each other by heat application or pressure. In FIG. 20A, the supporting substrate 105 is on a substrate stage 225. The semiconductor substrate 101 for transfer is carried by a transfer means 227 above the supporting substrate 105 and its position is adjusted so as to be attached to a given position. Then, as shown in FIG. 20B, the transfer means 227 comes close to the substrate stage 225 and put the semiconductor substrate 101 for transfer on the supporting substrate 105. The semiconductor substrate 101 for transfer is attached by pressure with a pushpin 230 of the transfer means 227 and a position to be bonded is fixed. After that, as shown in FIG. 20C, a pressure means 228 provided with a heater 229 moves and push and pressure the semiconductor substrate 101 for transfer on the substrate stage 225. Keeping this state, the semiconductor substrate 101 for transfer and the supporting substrate 105 are heated by the heater 229 of the pressure means 228 and a heater 226 of the substrate stage 225 so that bonding strength of these substrates are enhanced.

Figure 15B:
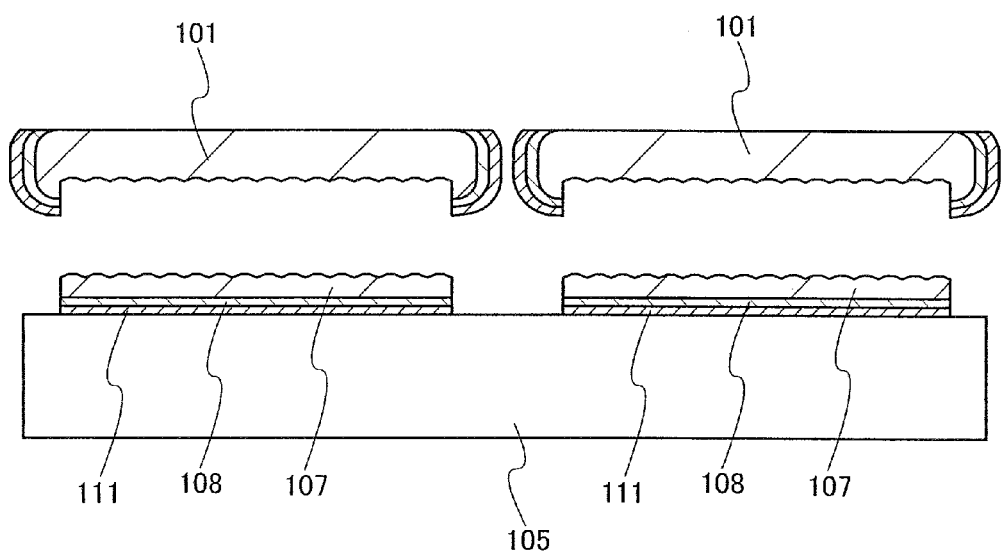

FIG. 15B illustrates a step where part of the semiconductor substrate 101 for transfer is separated from the supporting substrate 105 by thermal treatment, with the use of the damaged layer 109 as a cleavage surface. The temperature of the thermal treatment is preferably equal to or higher than a temperature of film formation of the second insulating layer 111 and equal to or lower than the upper temperature limit of the supporting substrate 105. For example, by performing thermal treatment at 400 to 600° C., the volume of microvoids formed in the damaged layer 109 is changed and the semiconductor substrate 101 for transfer is cleaved along the damaged layer 109. Since the second insulating layer 111 is bonded to the supporting substrate 105, the single crystal semiconductor layer 107 having the same crystallinity as that of the semiconductor substrate 101 for transfer is left remaining over the supporting substrate 105. Note that end portions of the semiconductor substrate 101 for transfer are chamfered. In that case, peripheral end portions are not transferred and left with the semiconductor substrate 101 for transfer because the peripheral end portions are not firmly attached to the supporting substrate 105.

The separated semiconductor substrate 101 for transfer can be reused by flattening treatment of its surface. That is, according to this embodiment mode, by implanting cluster ions of hydrogen, a single crystal semiconductor layer can be separated to have a thickness of 1 µm or less, preferably 500 nm or less, from the surface of the semiconductor substrate 101 for transfer. Therefore, the number of recyclable times can be increased.

(Step for Transferring a Single Crystal Semiconductor Layer to a Supporting Substrate—2)

FIGS. 16A to 16C and FIGS. 17A and 17B illustrate another example of steps for forming the single crystal semiconductor layer 107 from the semiconductor substrate 101 for transfer on the supporting substrate 105.

Figure 16A:
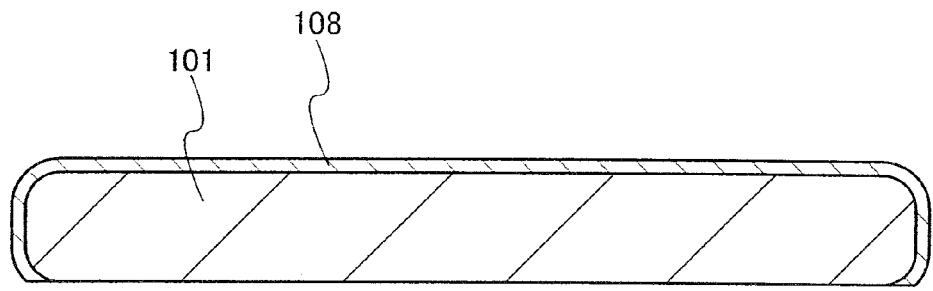
FIGS. 16A to 16C are cross-sectional views of steps of forming a single crystal semiconductor layer over a supporting substrate.
Figure 16B:
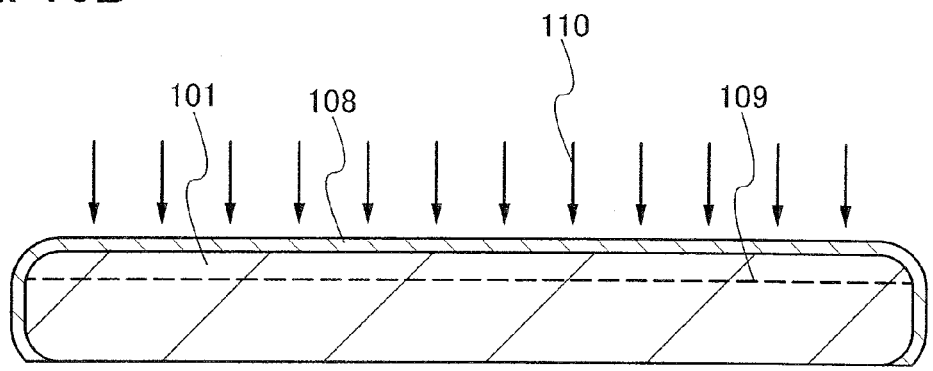
Figure 16C:
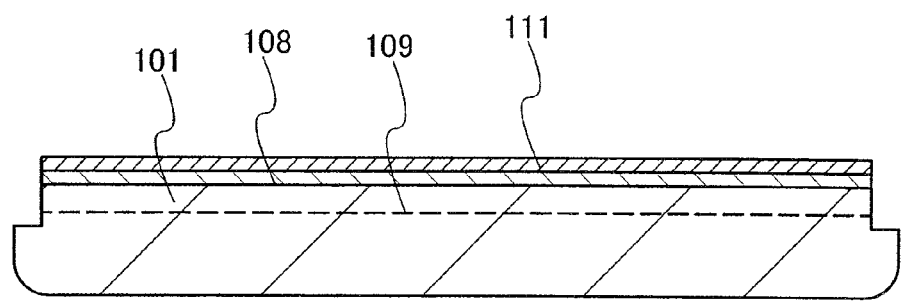

As shown in FIGS. 16A and 16B, the first insulating layer 108 containing nitrogen and the damaged layer 109 are formed over the semiconductor substrate 101 for transfer in a manner similar to that as described above. After that, the second insulating layer 111 is formed. Then, as shown in FIG. 16C, a peripheral portion of the semiconductor substrate 101 for transfer is etched deeper than the damaged layer to be removed.

Since the end portions of the semiconductor substrate 101 for transfer are chamfered, a flat bonding surface can be formed on the semiconductor substrate 101 for transfer by removing a region of end portions. Also through such processing method, the single crystal semiconductor layer 107 can be formed selectively in a region on an inner side than the peripheral end portions. By removing the region of end portions of the semiconductor substrate 101 for transfer, generation of dusts due to partial separation of the region can be prevented.

Figure 17A:
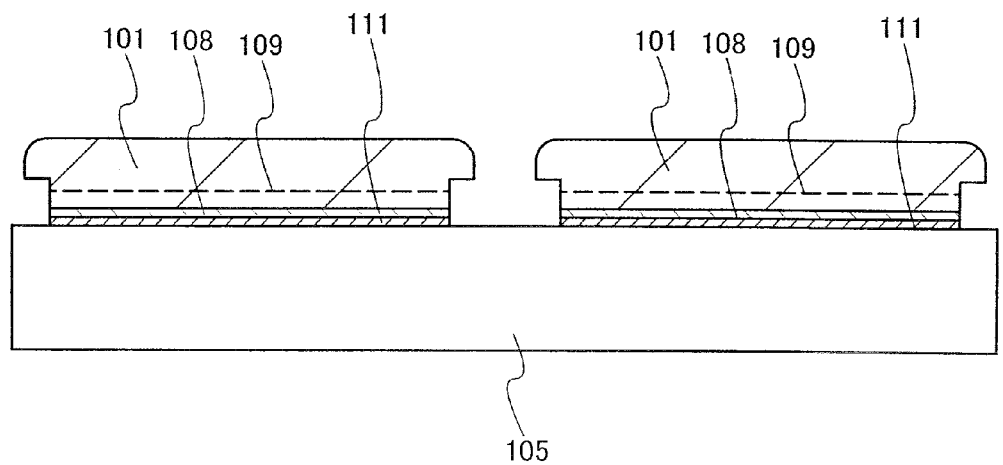
FIGS. 17A and 17B are cross-sectional views of steps of forming a single crystal semiconductor layer over a supporting substrate.
Figure 17B:
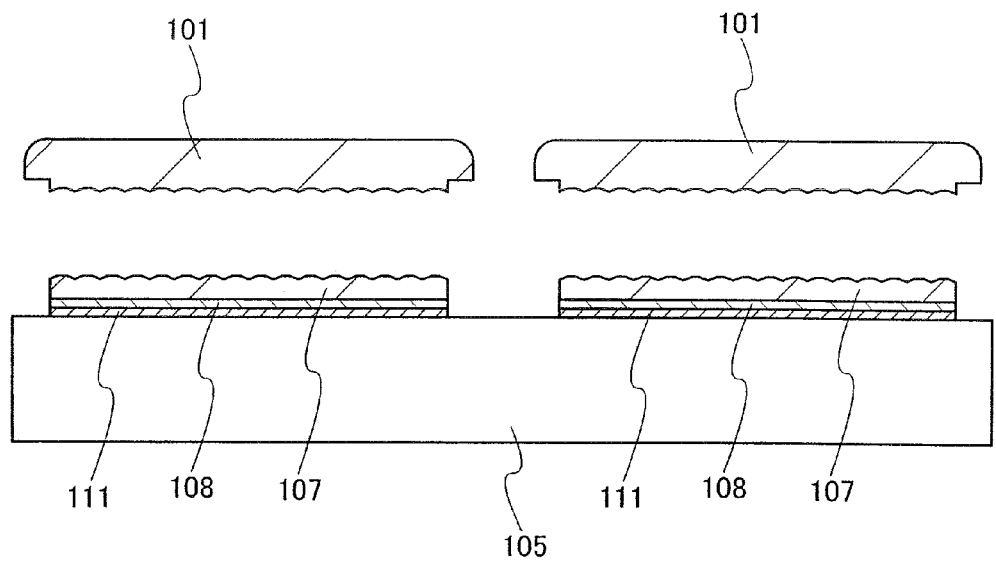

After that, as shown in FIG. 17A, the semiconductor substrate 101 for transfer and the supporting substrate 105 are bonded to each other and treatment for enhancing bonding strength such as thermal treatment is performed thereon. In FIG. 17B, by separating part of the semiconductor substrate 101 for transfer from the supporting substrate 105 by thermal treatment, with the user of the damaged layer 109 as a cleavage surface, the single crystal semiconductor layer 107 can be formed over the supporting substrate 105.

(Step for Processing a Single Crystal Semiconductor Layer Transferred to a Supporting Substrate)

The cleavage surface of the single crystal semiconductor layer 107 formed over the supporting substrate 105, where the semiconductor substrate 101 for transfer is cleaved in FIG. 15B or FIG. 17B, is comparatively flat. Accordingly, thermal treatment at a high temperature of more than 1000° C. and flattening treatment by CMP, which has so far been necessary, can be skipped. Also in such case, treatment for smoothing a surface is preferably performed by laser light irradiation of the surface in an inert gas (for example, a nitrogen atmosphere, a rare gas atmosphere, or the like) having an oxygen concentration of 10 ppm or less. This is because concentration distribution of hydrogen in the damaged layer 109 is small and concentrated by implantation of hydrogen ions which are ionized hydrogen and whose mass is larger than proton.

Figure 18A:
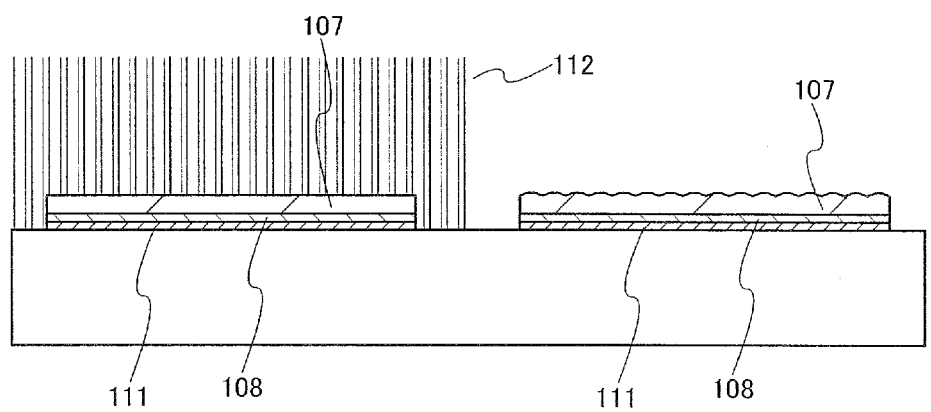
FIGS. 18A and 18B are cross-sectional views of steps of forming a single crystal semiconductor layer over a supporting substrate.

Next, as shown in FIG. 18A, the surface of the single crystal semiconductor layer 107 is etched to remove part thereof which is made rough when the damaged layer 109 is separated. Etching is performed by dry etching or wet etching. Moreover, a crystal defect is generated in the single crystal semiconductor layer 107 bonded to the supporting substrate 105 when the single crystal semiconductor layer 107 is separated along the damaged layer 109. Further, the surface thereof is not flat. In order to suppress the crystal defect and improve flatness, the single crystal semiconductor layer 107 is preferably irradiated with a laser beam 112 as shown in FIG. 18A.

By irradiation of the single crystal semiconductor layer 107 with the laser beam 112, at least the surface of the single crystal semiconductor layer 107 melts and then solidifies to be recrystallized. In this procedure, the surface of the single crystal semiconductor layer 107 can be flattened. The irradiation with the laser beam 112 makes the surface of the single crystal semiconductor layer 107 melt but the supporting substrate 105 is hardly heated. Therefore, a supporting substrate with low heat resistance, such as a glass substrate can be used.

As a laser oscillator that oscillates the laser beam 112, the one that oscillates light with wavelength in a range from ultra violet to visible light is selected. The wavelength of the laser beam 112 is set to be absorbed in the single crystal semiconductor layer 107. The wavelength of the laser beam 112 is determined in consideration of the skin depth of the laser light, and the like. For example, the wavelength can be in a range of greater or equal to 190 nm and less than or equal to 700 nm. A laser oscillator can oscillate a continuous wave laser, a pseudo continuous wave laser, or a pulsed laser. A pulsed laser is preferable because the single crystal semiconductor layer is partially melted. For example, in the case of a pulsed laser, the repetition frequency is 1 MHz or less and the pulse width is 10 to 500 nsec; e.g., an XeCl excimer laser with a repetition frequency of 10 to 300 Hz, a pulse width of 25 nsec, and a wavelength of 308 nm can be used.

The irradiation with the laser beam 112 is preferably performed in an inert atmosphere such as a rare gas atmosphere or a nitrogen atmosphere, or in a vacuum. In order to perform the irradiation with the laser beam 112 in an inert atmosphere, irradiation with the laser beam 112 may be performed in an airtight chamber while the atmosphere in the chamber is controlled. In the case where the chamber is not used, by blowing an inert gas such as a nitrogen gas to the surface to be irradiated with the laser beam 112, the laser irradiation with the laser beam 112 in the inert atmosphere can be realized.

The flatness of the single crystal semiconductor layer 107 is more improved in an inert atmosphere such as a nitrogen atmosphere or in a vacuum than in an air atmosphere. Further, generation of cracks or ridges are suppressed more effectively in an inert atmosphere such as a nitrogen atmosphere or in a vacuum than in an air atmosphere. Accordingly, an energy range within which the laser beam 112 can be employed is widened.

Figure 21:
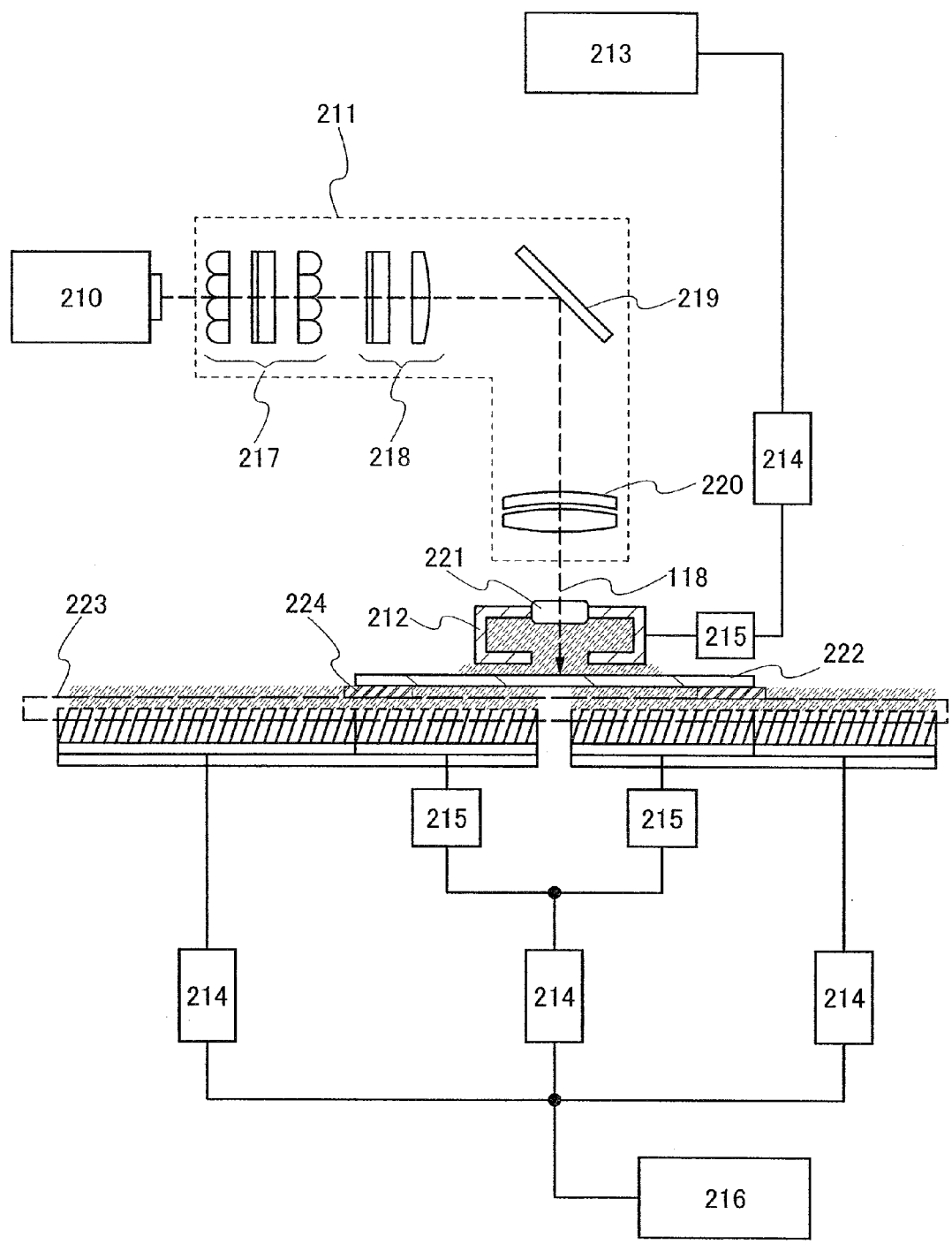
FIG. 21 is a schematic diagram for describing a laser process apparatus.

An example of a laser processing apparatus will be described with reference to FIG. 21. The laser processing apparatus includes a laser oscillator 210, an optical system 211 that condenses and extends laser light into a thin linear beam, a gas jetting pipe 212 that controls the atmosphere of a region to be irradiated with a laser, a gas supply portion 213 that supplies a gas for controlling atmosphere to the gas jetting pipe 213, a flow rate control portion 214, a gas heating portion 215, a substrate stage 222 that floats and carries the supporting substrate 105, a guide rail 223 that supports both ends of a substrate and carries it, and a gas supply portion 216 that supplies a gas for floating to the substrate stage 222.

As the laser oscillator 210, the one that oscillates light with wavelength in a range from ultra violet to visible light is selected. The laser oscillator preferably oscillates a pulsed ArF, KrF, or XeCl excimer laser, or a solid-state laser such as an Nd-YAG laser or YLF laser, whose repetition frequency is 1 MHz or less and pulse width is 10 to 500 nsec. For example, an XeCl excimer laser with a repetition frequency of 10 to 300 Hz, a pulse width of 25 nsec, and a wavelength of 308 nm can be used.

The optical system 211 condenses and extends laser light to form a laser beam a portion irradiated with which has a linear shape in cross-section. The optical system 211 that forms a linear beam includes a cylinder lens array 217, a cylinder lens 218, a mirror 219, and a doublet cylinder lens 220. The linear laser light of approximately 100 to 700 mm in a longer direction and approximately 100 to 500 μm in a shorter direction can be emitted although it depends on the size of a lens.

The supporting substrate 105 is irradiated with the laser beam condensed into a linear shape through a light introduce window 221 of the gas jetting pipe 212. The gas jetting pipe 212 is provided in vicinity to the supporting substrate 105. A nitrogen gas is supplied to the gas jetting pipe 212 from the gas supply portion 213. The nitrogen gas is jetted from an opening portion of the gas jetting pipe 212, which faces the supporting substrate 105. The opening portion of the gas jetting pipe 212 is provided in accordance with an optical axis of the linear laser beam so that the supporting substrate 105 is irradiated with the laser beam that enters from the light introduce window 221. Due to the nitrogen gas jetted from the opening portion of the gas jetting pipe 212, a region to be irradiated with the laser beam comes to have a nitrogen atmosphere.

The temperature of a surface of the supporting substrate 105, which is to be irradiated with the laser beam, can be controlled with the nitrogen gas which is supplied to the gas jetting pipe 212 and heated up to 250 to 600° C. in the gas heating portion 215. By heating the region to be irradiated, time for melting due to laser beam irradiation can be controlled as described above.

Air or nitrogen is supplied to the substrate stage 222 from the gas supply portion 216 through the flow rate control portion 214. Gas supplied from the gas supply portion 216 is jetted so that a bottom surface of the supporting substrate 105 is sprayed with the gas from the main surface of a substrate stage 222, whereby the supporting substrate 105 is floated. The supporting substrate 105 is carried with its both ends mounted on a slider 224 which moves on the guide rail 223. Since the supporting substrate 105 is sprayed with gas from the substrate stage 222 side, the supporting substrate 105 can be carried without being curved while it is floated. In the laser processing apparatus of this embodiment mode, since a nitrogen gas is jetted from the gas jetting pipe 212 to a top surface of the supporting substrate 105, the supporting substrate 105 can be prevented from being bent by spraying a back surface of the supporting substrate 105 with the gas. The substrate stage 222 with such structure is effective for processing a glass substrate of more than 500 mm on a side and 1 mm or less in thickness. For example, a 600×720 mm or 730×920 mm glass substrate with a thickness of 0.7 mm or less can be processed.

The substrate stage 222 can be divided into the vicinity of a laser irradiation portion and the other region. The vicinity of the laser irradiation portion of the substrate stage 222 can be sprayed with a nitrogen gas heated by the gas heating portion 215, so that the supporting substrate 105 can be heated.

After the single crystal semiconductor layer 107 is irradiated with the laser beam 112, heat treatment at greater than or equal to 500 and less than or equal to 650° C. is preferably performed on it. This heat treatment can remove a defect of the single crystal semiconductor layer 107 and can reduce distortion of the single crystal semiconductor layer 107, which are not improved by the irradiation with the laser beam 112. An RTA (rapid thermal anneal) apparatus, a resistance heating furnace, or microwave heating apparatus can be used for this heat treatment. As the RTA apparatus, a GRTA (gas rapid thermal anneal) apparatus or an LRTA (lamp rapid thermal anneal) apparatus can be used. For example, when a resistance heating furnace is used, it is preferable that the single crystal semiconductor layer 107 be heated at 550° C. for four hours after it is heated at 500° C. for an hour.

Figure 18B:
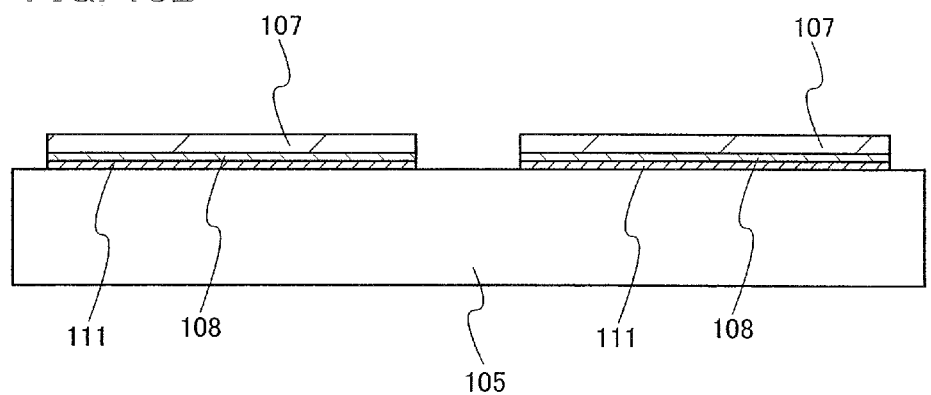

Through the above steps, the single crystal semiconductor layer 107 can be formed over the supporting substrate 105 as shown in FIG. 18B. With the use of this single crystal semiconductor layer 107, a display panel can be manufactured.

(Display Panel Over a Supporting Substrate)

Figure 22:
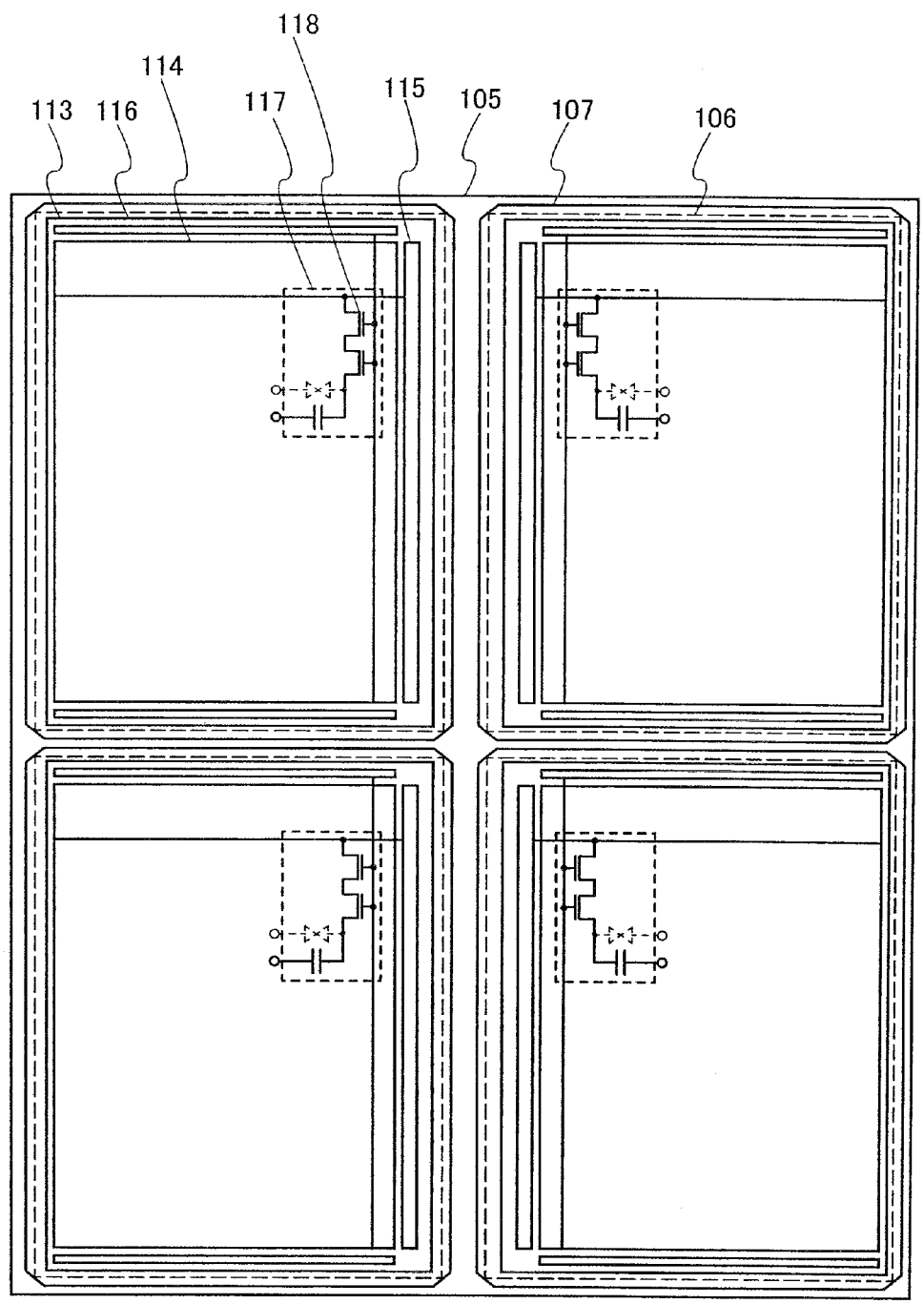
FIG. 22 shows an example of forming a display panel by using a single crystal semiconductor layer formed over a supporting substrate.

FIG. 22 illustrates an example of forming a display panel 113 with the single crystal semiconductor layer 107 formed over the supporting substrate 105. A screen region 114 includes a pixel 117. In the pixel 117, a transistor 118 is formed by using the single crystal semiconductor layer 107. By using a single crystal semiconductor, the size of a transistor can be small, so that the aperture ratio of a pixel can be increased. Further, with a transistor formed by using a single crystal semiconductor, a liquid crystal display panel that operates at a frame frequency of 120 MHz or more can be easily manufactured. By using the single crystal semiconductor layer 107, a data driver circuit 115 and a gate driver circuit 116 can be formed in the display panel 113 in addition to the screen region 114. Further, a pixel processor, a memory, and the like can be formed over the same substrate.

(Step of Manufacturing a Display Panel)

In this embodiment mode, one example of steps of manufacturing a display panel will be described. In the display panel, by forming a transistor with the single crystal semiconductor layer, a transistor of a pixel that controls a display medium and a transistor of a driver circuit can be formed over the same substrate.

Figure 23:
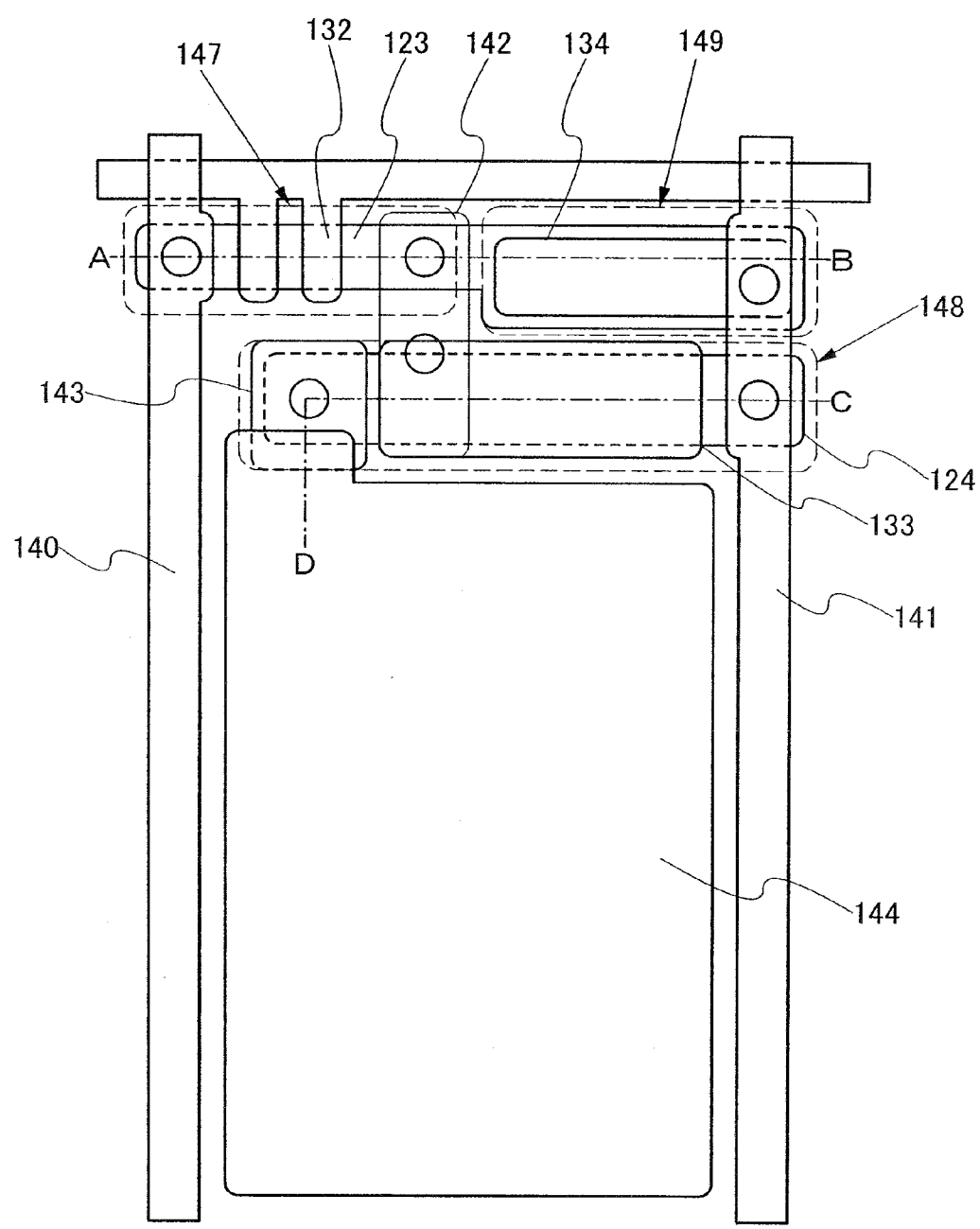
FIG. 23 shows one example of a pixel used for a display panel provided with a first transistor to which a data signal is input and a second transistor connected to a pixel electrode.

FIG. 23 illustrates one example of a pixel used for the display panel, which is provided with a first transistor to which a data signal is input and a second transistor which is connected to a pixel electrode. In the pixel, an n-channel transistor 147, a p-channel transistor 148, and a capacitor element 149 are provided. In the description below, one example of steps of manufacturing a transistor in this pixel and a transistor in a driver circuit that can be manufactured at the same time will be illustrated.

A semiconductor substrate which includes the second insulating layer 111, the first insulating layer 108, and the single crystal semiconductor layer 107 formed over the supporting substrate 105 is prepared (FIG. 24A). As the single crystal semiconductor layer 107, an n-type single crystal semiconductor layer with a resistivity of 10 Ωcm or more and a crystal plane of (100) or (110) is employed. An n-type single crystal semiconductor layer with a thickness of 30 to 100 nm, for example, 50 nm is used as the single crystal semiconductor layer 107.

The single crystal semiconductor layer 107 is etched into a desired shape in accordance with the arrangement of the transistor to form single crystal semiconductor layers 121, 122, 123, and 124, which are divided into an island shape (FIG. 24B). A semiconductor layer in a region except the single crystal semiconductor layers 121, 122, 123, and 124 is removed; however, the supporting substrate 105 is not exposed because the first insulating layer 108 and the second insulating layer 111 are formed. Accordingly, since the first insulating layer 108 and the second insulating layer 111 are formed, the semiconductor layer can be prevent from being contaminated by diffusion of impurities such as alkaline metals from the supporting substrate 105.

Since the single crystal semiconductor layers 121, 122, 123, and 124 are n-type semiconductor layers, masks 125 are provided for the single crystal semiconductor layers 122 and 124 that forms p-channel transistors, and a p-type impurity is added to the single crystal semiconductor layers 121 and 123. As the p-type impurity, boron is used and added at a concentration of $5\times10^{16}$/cm$^3$ to $1\times10^{18}$/cm$^3$.

Next, masks 126 that protect channel regions of the single crystal semiconductor layers 121 and 123 and masks 127 that protect the entire single crystal semiconductor layer 122 and 124 are formed with a photo resist. Then, phosphorus or arsenic that imparts n-type conductivity is added as an impurity to the single crystal semiconductor layers 121 and 123 (FIG. 25A). The concentration of the impurity is $1\times10^{16}$/cm$^3$ to $5\times10^{19}$/cm$^3$. Through this, first impurity regions 128 are formed in the respective single crystal semiconductor layers 121 and 123. The first impurity region 128 functions as a lightly doped drain of an n-channel transistor.

The masks 126 and 127 are removed and a gate insulating layer 129 is formed. For example, the gate insulating layer 129 is formed to a thickness of greater than or equal to 10 and less than or equal to 150 nm with silicon oxide or silicon oxynitride by plasma CVD, sputtering, or the like.

Alternatively, the gate insulating layer 129 can be formed by processing the single crystal semiconductor layers 121, 122, 123, and 124 with a plasma excited by microwaves. For example, surfaces of the single crystal semiconductor layers 121, 122, 123, and 124 are oxidized or nitrided by a nitrous oxide ($N_2O$) diluted with Ar by 1 to 3 times (flow rate) and application of electric power of microwaves (2.45 GHz) of 3 to 5 kW under a pressure of 10 to 30 Pa. Through this process, an insulating film with a thickness of 1 to 10 nm (preferably 2 to 6 nm) is formed. Further, nitrous oxide ($N_2O$) and silane ($SiH_4$) are introduced and electric power of microwaves (2.45 GHz) of 3 to 5 kW is applied to the single crystal semiconductor layers 121, 122, 123, and 124 under a pressure of 10 to 30 Pa to form a silicon oxynitride film by CVD, which is to be a gate insulating film. By combination of solid phase reaction and reaction due to CVD, a gate insulating film with low interface state density and high withstand voltage can be formed.

Gate electrodes 130, 131, 132, and 133 are formed over the gate insulating layer 129, corresponding to the respective single crystal semiconductor layers 121, 122, 123, and 124 (FIG. 25B). A capacitor electrode 134 is formed over the single crystal semiconductor layer 123. Side surfaces of the gate electrode is preferably slanted at 30 to 75 degree angle, preferably 35 to 60 degree angle. This is for improving coverage with a passivation film. The gate electrode and the capacitor electrode are formed of an element such as tantalum, tungsten, titanium, molybdenum, aluminum, copper, chromium, or neodymium, or an alloy material or a compound material containing the element listed above as its main component. Further, it is preferable that a nitride layer of the metal listed above be formed on the gate insulating layer 129 side to improve adhesion of the gate electrode. For example, the gate electrode is formed by stacking a tantalum nitride and tungsten from the gate insulating layer side. The gate electrode 130 over the single crystal semiconductor layer 121 is formed so as to overlap with the first impurity region 128. Through this, a lightly doped drain that overlaps with the gate electrode is formed. The first impurity region 128 of the single crystal semiconductor layer 123 remains as not to overlap with the gate electrode 132.

Next, an impurity that imparts p-type or n-type conductivity is added to the semiconductor layer to form a source and drain region of the transistor (FIG. 26A). Second impurity regions 135 are formed in the single crystal semiconductor layers 121 and 123 with the gate electrodes 130 and 132 used as masks. The second impurity regions 135 are n-type and are formed by addition of phosphorus or arsenic at a concentration of $1\times10^{17}/cm^3$ to $5\times10^{19}/cm^3$. Third impurity regions 136 are formed in the single crystal semiconductor layers 122 and 124 with the gate electrodes 131 and 133 used as masks. The third impurity regions 136 are p-type and are formed by addition of boron at a concentration of $1\times10^{17}/cm^3$ to $5\times10^{19}/cm^3$.

Then, after a passivation layer 137 and an interlayer insulating layer 138 are formed over the gate electrode and contact holes are formed, a wiring 139 is formed (FIG. 26B). The passivation layer 137 is preferably formed of silicon nitride. The interlayer insulating layer 138 is formed of an inorganic insulating material such as silicon oxide and silicon oxynitride, or an organic insulating material such as polyimide or acrylic. The wiring 139 is formed using a stacked layer body of a metal layer of aluminum, aluminum-neodymium (Al—Nd), magnesium-silver (Mg—Ag), or the like, and a metal layer of tantalum, titanium, molybdenum, tungsten, or chromium which sandwiches the aforementioned metal layer.

In the pixel shown in FIG. 23, a data line 140, a power supply line 141, a wiring 142 in the pixel, and a pixel electrode connecting wiring 143 are formed as wirings. Further, a pixel electrode 144 is formed so as to electrically connected to the pixel electrode connecting wiring 143.

The pixel electrode 144 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

Further, a conductive composition containing a conductive macromolecule (also referred to as a conductive polymer) can also be used as the pixel electrode 144. A thin film of a conductive composition preferably has a sheet resistance of 10000 Ω/square or less. When a thin film of a conductive composition is formed as a pixel electrode layer having a light-transmitting property, light transmittance is preferably greater than or equal to 70% at a wavelength of 550 nm. In addition, the resistivity of the conductive macromolecule which is contained in the conductive composition is preferably 0.1 Ω·cm or less.

As the conductive macromolecule, a so-called π electron conjugated conductive macromolecule can be used. For example, polyaniline and a derivative thereof, polypyrrole and a derivative thereof, polythiophene and a derivative thereof, and a copolymer of those materials can be given. Specific examples of the conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

The above conductive macromolecule may be used alone, or an organic resin may be added thereto in order to adjust the characteristic of the films. Furthermore, by doping a conductive composition with acceptor type dopant or donor type dopant, an oxidation-reduction potential of a conjugated electron of a conjugated conductive macromolecule is changed; therefore, electrical conductivity may be adjusted. The aforementioned conductive composition is dissolved in water or an organic solvent (e.g., an alcohol-based solvent, a ketone-based solvent, an ester-based solvent, a hydrocarbon-based solvent, an aromatic-based solvent) and a thin film which serves as the pixel electrode 144 can be formed by an application method, a coating method, a droplet discharge method (also referred to as an ink-jet method), a printing method, or the like.

Through the above-described steps, the n-channel transistor 145 and the p-channel transistor 146, which form the driver circuit or other logic circuits, and the n-channel transistor 147, the p-channel transistor 148, and the capacitor element 149, which are included in the pixel can be formed using the single crystal semiconductor layer over the supporting substrate 105. According to this embodiment mode, by using the single crystal semiconductor for manufacturing the transistors in a pixel region and a driver circuit region, operation speed can be improved. Therefore, in the display panel, frame frequency can be increased and display characteristics can be improved. Further, by using the single crystal semiconductor for forming the transistor in the pixel, variations in characteristics are few and images can be displayed without unevenness.

(Display Device)

As a display device formed using a display panel, one example of a pixel portion in an electroluminescence display panel will be shown.

Figure 27:
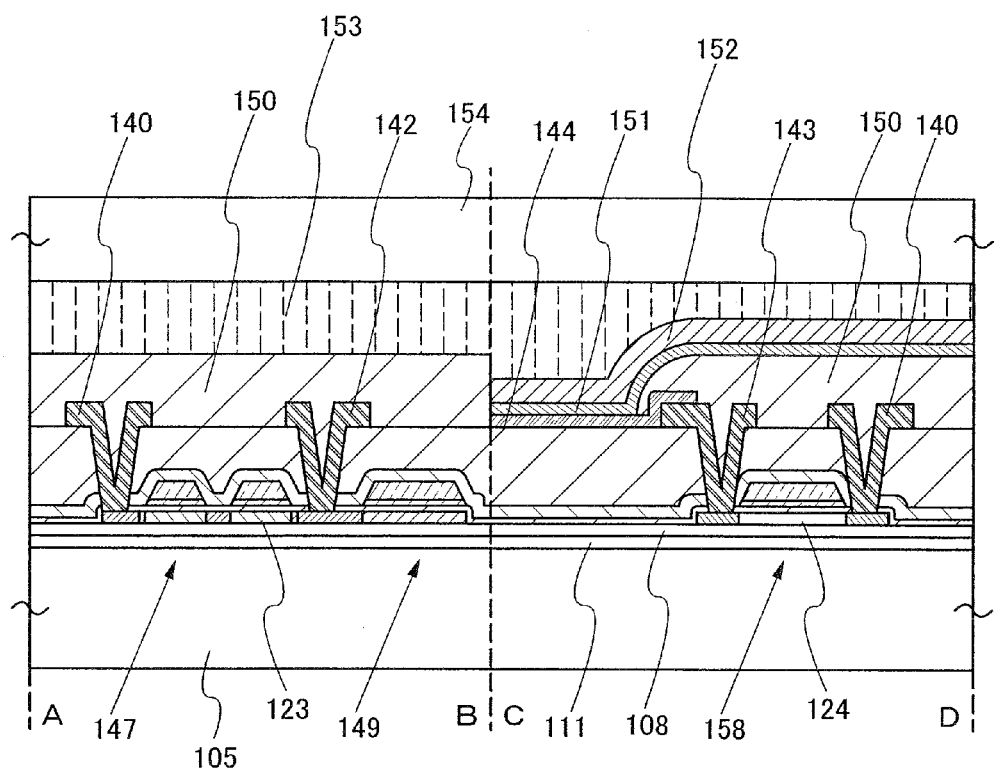
FIG. 27 is a cross-sectional view of the pixel corresponding to FIG. 23.

FIG. 27 illustrates a cross-sectional view of the pixel corresponding to FIG. 23. The n-channel transistor 147, the p-channel transistor 148, and the capacitor element 149 are provided in the pixel. In this display device, each pixel is provided with a light-emitting element that includes a layer (EL layer) containing an electroluminescent material between electrodes. The pixel electrode 144 is connected to the p-channel transistor 148. The periphery of the pixel electrode 144 is surrounded by a partition wall insulating layer 150. An EL layer 151 is formed over the pixel electrode 144. A counter electrode 152 is formed over the EL layer 151. The pixel portion is filled with a sealing layer 153 and is provided with a sealing plate 154 as a reinforcing plate.

In the electroluminescent display device of this embodiment mode, such pixels are arranged in a matrix to form a display screen. In this case, a channel portion of a transistor of a pixel is formed using the single crystal semiconductor layer. Therefore, there are advantages in that characteristics do not vary from transistor to transistor and emission luminance does not vary from pixel to pixel. Therefore, drive with the brightness of a light emitting element being controlled by a current becomes easy, and a correction circuit that corrects variation in transistor characteristics becomes unnecessary. Thus, a load on a driver circuit can be reduced.

Figure 28:
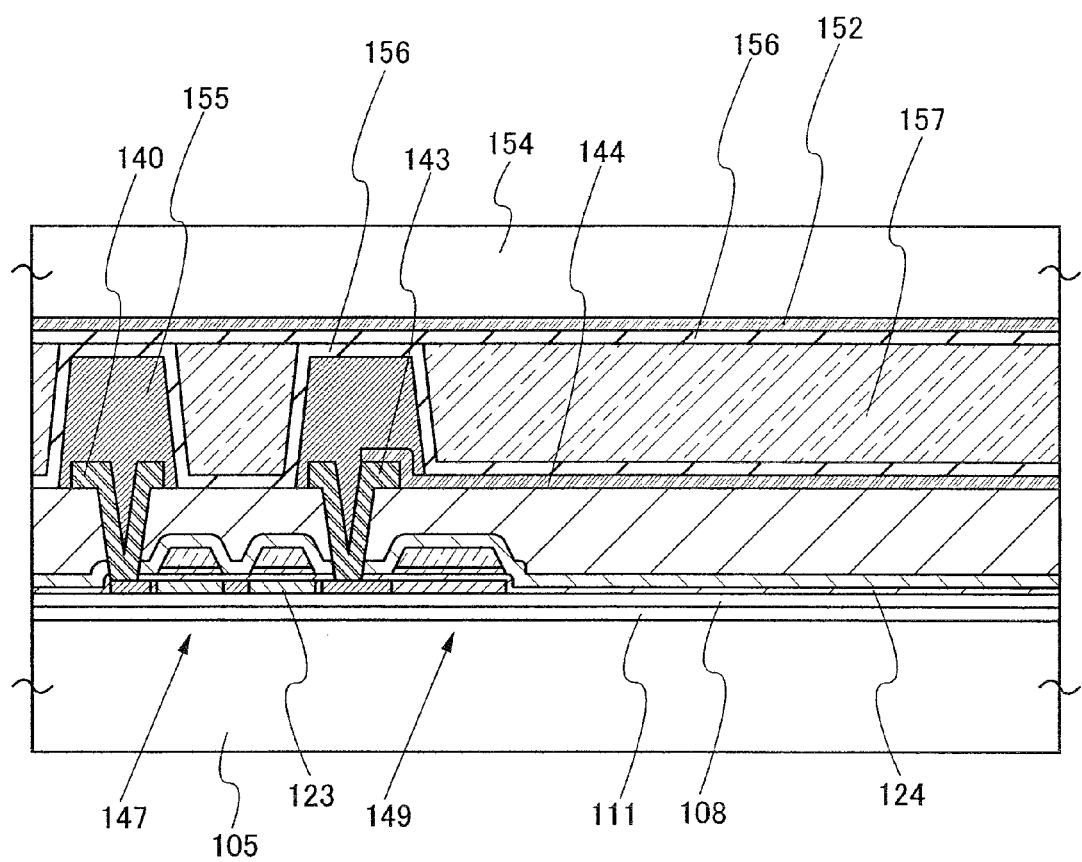
FIG. 28 shows one example of a pixel in a liquid crystal display device in which a pixel transistor is formed by using a single crystal semiconductor layer.

FIG. 28 illustrates one example of a pixel in a liquid crystal display device in which the n-channel transistor 147 is formed using the single crystal semiconductor layer. Since a contact hole that connects the data line 140 and the pixel electrode connecting wiring 143 has a depression, a spacer 155 is provided so that the depression bump is filled with it. The counter electrode 152 is formed on the sealing plate 154 and alignment films 156 sandwich a liquid crystal layer 157 therebetween. According to this embodiment mode, by using a single crystal semiconductor layer for forming a transistor in a pixel, the size of a transistor can be small, so that an aperture ratio of a pixel can be increased. Further, by using a single crystal semiconductor layer for forming a transistor, a liquid crystal display panel that operates at a frame frequency of 120 MHz or more can be easily manufactured.

(Electronic Device)

In this embodiment mode, electronic devices employing the above-described display device will be described with reference to FIGS. 30A to 30H and FIGS. 31A to 31C.

In this embodiment mode, following are illustrated as electronic devices: a camera such as a video camera or a digital camera, a goggle type display (a head mounted display), a navigation system, an audio reproducing device (car audio component set, or the like), a computer, a game machine, a portable information terminal (mobile computer, mobile phone, portable game machine, e-book reader, or the like), and an image reproducing device provided with a recording medium (specifically, a device provided with a display device that can reproduce a recording medium such as a digital versatile disc (DVD) and display the image), and the like.

Figure 30A:
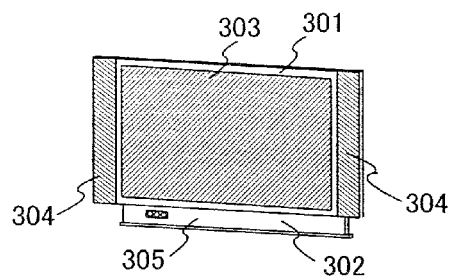
FIGS. 30A to 30H show examples of electronic devices.

FIG. 30A illustrates a television receiver or monitor of a personal computer. The television receiver or the monitor of the personal computer in FIG. 30A includes a housing 301, a supporting base 302, a display portion 303, a speaker portion 304, a video inputting terminal 305, and the like. By forming the display portion 303 with a transistor formed using a single crystal semiconductor, a television receiver or monitor of a personal computer with high reliability and performance can be provided.

Figure 30B:
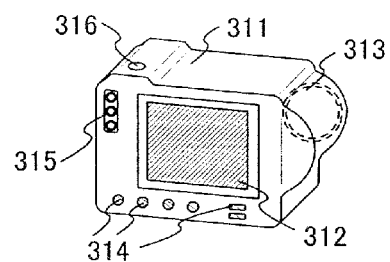

FIG. 30B illustrates a digital camera. An image receiving portion 313 is provided in the front side of a main body 311. A shutter button 316 is provided at the upper portion of the main body 311. A display portion 312, operation keys 314, and an external connection port 315 are provided at the backside of the main body 311. By forming the display portion 312 with a transistor formed using a single crystal semiconductor, a digital camera with high reliability and performance can be provided.

Figure 30C:
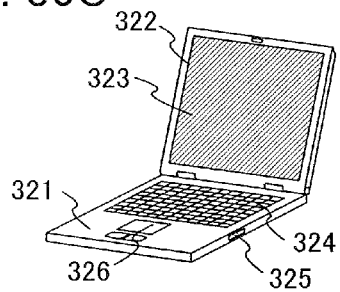

FIG. 30C illustrates a notebook computer. A main body 321 is provided with a keyboard 324, an external connection port 325, and a pointing device 326. Moreover, the main body 321 has a housing 322 having a display portion 323 attached thereto. By forming the display portion 323 with a transistor formed using a single crystal semiconductor, a notebook computer with high reliability and performance can be provided.

Figure 30D:
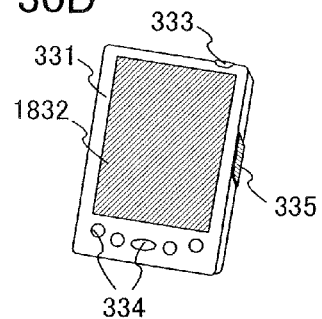

FIG. 30D illustrates mobile computer, which includes a main body 331, a display portion 332, a switch 333, operation keys 334, an infrared port 335, and the like. Furthermore, an active matrix display device is provided in the display portion 332. By forming the display portion 332 with a transistor formed using a single crystal semiconductor, a mobile computer with high reliability and performance can be provided.

Figure 30E:
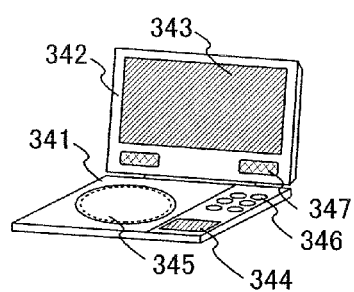

FIG. 30E illustrates an image reproducing device. A main body 341 is provided with a display portion (B) 344, a recording medium reader 345, and operation keys 346. Moreover, a housing 342 including a speaker portion 347 and a display portion (A) 343 is attached to the main body 341. By forming each of the display portions (A) 343 and (B) 344 with a transistor formed using a single crystal semiconductor, an image reproducing device with high reliability and performance can be provided.

Figure 30F:
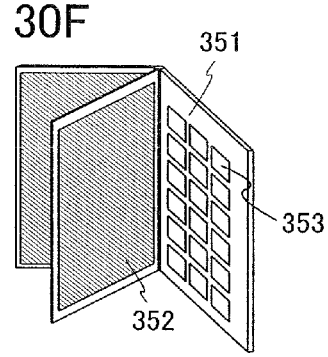

FIG. 30F illustrates an electronic book. A main body 351 is provided with operation keys 353. A plurality of display portions 352 are attached to the main body 351. By forming the display portion 352 with a transistor formed using a single crystal semiconductor, an electronic book with high reliability and performance can be provided.

Figure 30G:
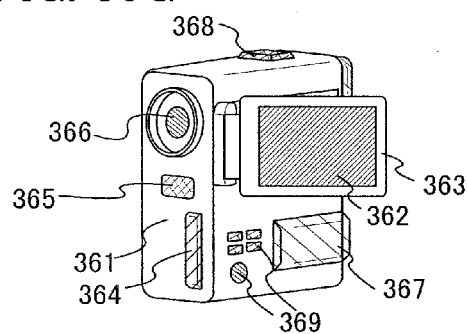

FIG. 30G illustrates a video camera. A main body 361 is provided with an external connection port 364, a remote controller receiving portion 365, an image receiving portion 366, a battery 367, an audio input portion 368, and operation keys 369. Moreover, a housing 363 including a display portion 362 is attached to the main body 361. By forming the display portion 362 with a transistor formed using a single crystal semiconductor, a video camera with high reliability and performance can be provided.

Figure 30H:
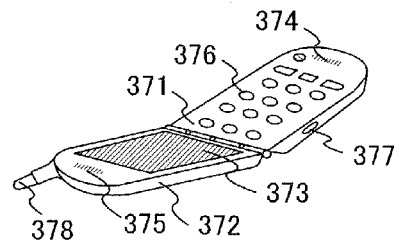

FIG. 30H illustrates a mobile phone, which includes a main body 371, a housing 372, a display portion 373, an audio input portion 374, an audio output portion 375, operation keys 376, an external connection port 377, an antenna 378, and the like. By forming the display portion 373 with a transistor formed using a single crystal semiconductor, a mobile phone with high reliability and performance can be provided.

FIGS. 31A to 31C illustrate a structural example of a portable electronic device 400 having functions as a telephone and an information terminal. FIG. 31A is a front view, FIG. 31B is a back view, and FIG. 31C is a developed view. The portable electronic device 400 has functions as both a telephone and an information terminal and is an electronic device so-called a smartphone which is capable of various data processing in addition to voice call.

The portable electronic device 400 includes housings 401 and 402. The housing 401 is provided with a display portion 411, a speaker 412, a microphone 413, operation keys 414, a pointing device 415, a lens 416 for camera, an external connection terminal 417, and the like. The housing 402 is provided with a keyboard 421, an external memory slot 422, a lens 423 for camera, a light 424, an earphone terminal 425, and the like. Moreover, an antenna is built into the housing 401. In addition to the above-described structure, a wireless IC ship, a small size memory device, or the like can be built therein.

The display portion 411 includes a transistor formed using a single crystal semiconductor. An image displayed (and direction in which the image is displayed) in the display portion 411 variously changes with respect to the usage pattern of the portable electronic device 400. Moreover, since the display portion 411 and the lens 416 for camera are provided on the same surface, voice call (so-called videophone) with images can be possible. Note that the speaker 412 and the microphone 413 can be used not only for voice call but also for recording, reproducing, or the like. In the case where a still image and a moving image are shot by using the lens 423 for camera (and the light 424), the display portion 411 is used as a finder. The operation keys 414 are used for incoming/outgoing of phone call, inputting simple information such as e-mail, screen scrolling, moving cursor, and the like.

The housings 401 and 402 overlapped with each other (FIG. 31A) slide and can be developed as shown in FIG. 31C, so that the portable electronic device 400 can be used as an information terminal. In that case, smooth operation with the keyboard 421 and the pointing device 415 can be performed. The external connection terminal 417 can be connected to various cables such as an AC adopter or a USB cable, whereby the portable electronic device 400 can be charged or can perform data communication with a computer or the like. Moreover, by inserting a recording medium into the external memory slot 422, the portable electronic device 400 can deal with storing and moving data with higher capacitance. In addition to the above-described functions, a function of wireless communication by using electromagnetic waves such as infrared rays, a function of receiving television, and the like can be included.

(Cluster Ions)

Hereinafter, cluster ions used in the step—1 for transferring a single crystal semiconductor layer to a supporting substrate will be described.

An ion doping apparatus that does not separate the mass of ions generated in an ion source has an advantage in that a plasma space related to the generation of ions is large and a large amount of ions can be generated and introduced. An ion implantation apparatus has a characteristic that mass separation of generated ions is performed and only specific ion species can be introduced; however, a problem of productivity is caused because ions are basically introduced by scanning with a point beam. As a method for generating plasma, for example, a method using thermo electrons generated by heating a filament can be given. However, there is no big difference of a method for generating plasma between any apparatuses.

On the other hand, the proportion of each of ion species in a generated hydrogen ion ($H^+$, $H_2^+$, $H_3^+$) is largely different between the case of an ion implantation apparatus and the case of an ion doping apparatus. For example, in the case of one ion doping apparatus, the proportion of generated ion species is approximately as follows: $H^+:H_2^+:H_3^+=1:1:8$. Moreover, $H_3^+$ accounting for approximately 80% is observed from a result of analysis on SIMS (secondary ion mass spectrometry) of a semiconductor substrate to which hydrogen ions are actually introduced. On the other hand, in the case of one ion implantation apparatus, the proportion of generated ion species is approximately as follows: $H^+:H_2^+:H_3^+=37:56:7$. That is, $H_3^+$ generated in the ion implantation apparatus is only 7% of the whole hydrogen ion generated.

Figure 29:
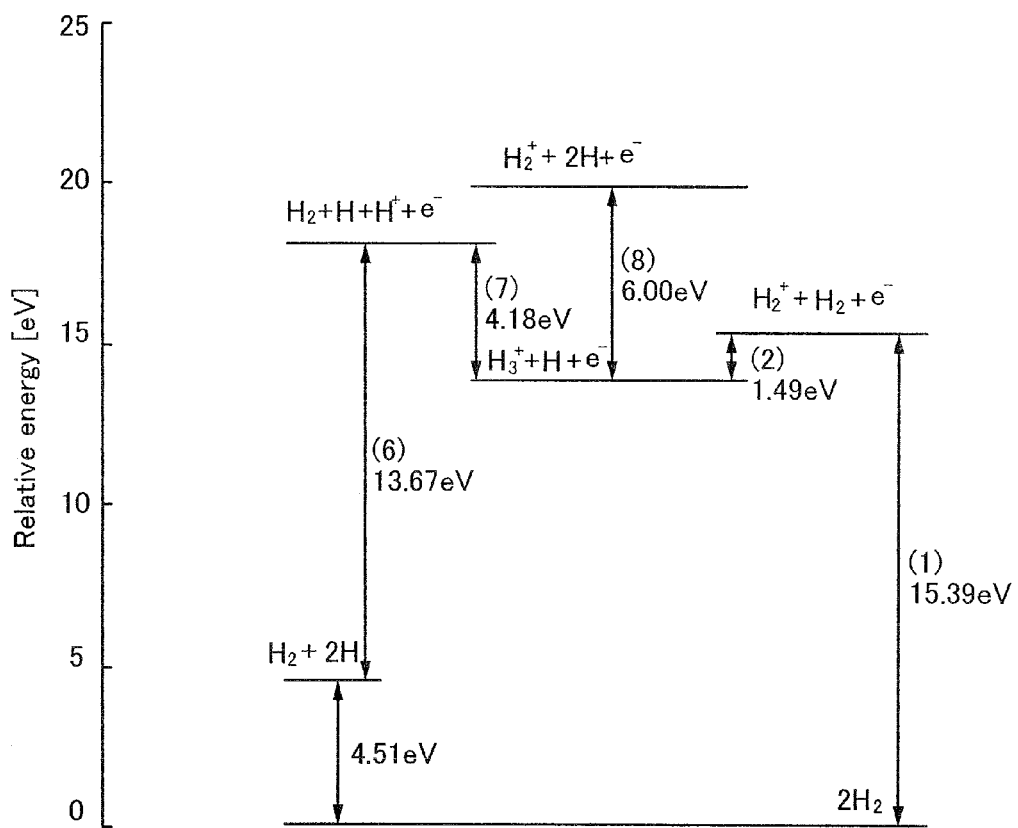
FIG. 29 shows an energy diagram of hydrogen.

The reason thereof is considered as follows. A major reaction in generation of a plasma from a hydrogen gas is generation of $H_2^+$ due to ionization by collision between electrons came out from a tungsten filament and hydrogen molecules. A reaction formula of this reaction is shown below. In addition, FIG. 29 illustrates an energy diagram of hydrogen. In FIG. 29, the vertical axis represents relative energy based on a hydrogen molecule. Hereinafter, +Q represents exothermal reaction and –Q represents endothermal reaction.

$$H_2^+ + e^- \rightarrow H_2^+ + 2e^- - Q \quad (Q=15.39 \text{ eV}) \tag{1}$$

When $H_2^+$ collides with a hydrogen molecule $H_2$, following reaction occurs:

$$H_2^+ + H_2 \rightarrow H_3^+ + H + Q \quad (Q=1.49 \text{ eV}) \tag{2}$$

The above-described reaction is an exothermal reaction of 1.49 eV, and $H_3^+$ is generated by transfer of a hydrogen atom. $H_3^+$ is formed of three atomic nucleuses and two electrons. This structure is kept stable with a triangular arrangement.

When $H_2^+$ collides with thermo electrons, following reaction occurs:

$$H_2^+ + e^- \rightarrow H + H + Q \quad (Q=10.88 \text{ eV}) \tag{3}$$

$$H_2^+ + e^- \rightarrow H^+ + H + e^- - Q \quad (Q=2.69 \text{ eV}) \tag{4}$$

Note that when $H_2^+$ collides with electrons, it is considered that only $H_2$ is generated; however, generally, dissociation of molecules shown by a formula below has been known and there is a high possibility that $H_2^+$ is also dissociated.

$$H_3^+ + e^- \rightarrow 3H + Q \quad (Q=4.88 \text{ eV}) \tag{5}$$

Due to H generated through the process of the above-described formulas (3), (4), and (5), reaction below further occurs.

$$H + e^- \rightarrow H^+ + 2e^- - Q \quad (Q=13.67 \text{ eV}) \tag{6}$$

$$H_2 + H^+ \rightarrow H_3^+ + Q \quad (Q=4.18 \text{ eV}) \tag{7}$$

$$H_2^+ + H \rightarrow H_3^+ + Q \quad (Q=6.00 \text{ eV}) \tag{8}$$

As shown in formulas (1) to (8), formation reaction of each ion may occur in a plasma region of a hydrogen gas. Since $H_3^+$ is more stable than $H^+$ and $H_2^+$, $H_3^+$ is easily formed as the possibility of collision of hydrogen molecules increases.

The ion doping apparatus and the ion implantation apparatus are different from each other in many aspects such as capability of selecting ion species, the size of plasma region, and the degree of vacuum. The degree of vacuum in the ion implantation apparatus is higher than that of the ion doping apparatus by about one digit, approximately $10^{-3}$ Pa. The possibility of collision of particles in gas phase depends on the number of particles per unit volume. Accordingly, in the case where the ion doping apparatus is used, the possibility of the reaction shown by the formula (2) in which $H_3^+$ is generated is approximately 10 times as that in the case of the ion implantation apparatus. Therefore, when the ion doping apparatus is used, $H_3^+$ is easily generated while $H_3^+$ is not easily generated when the ion implantation apparatus is used.

As described above, in view of introducing a larger amount of $H_3^+$, the ion doping apparatus is preferable to the ion implantation apparatus.

This application is based on Japanese Patent Application serial no. 2007-275823 filed with Japan Patent Office on Oct. 23, 2007, and Japanese Patent Application serial no. 2007-286996 filed with Japan Patent Office on Nov. 5, 2007, the entire contents of which are hereby incorporated by reference.

What is claimed is:

1. A manufacturing method of a display device comprising the steps of: cutting each of a plurality of substantially circular single crystal semiconductor wafers of 300 to 450 mm in diameter into a substantially quadrangular single crystal semiconductor substrate; forming a damaged layer by implantation of hydrogen ions in each of the plurality of substantially quadrangular single crystal semiconductor substrates; forming a bonding layer on each of the plurality of substantially quadrangular single crystal semiconductor substrates after the step of forming the damaged layer; bonding the plurality of substantially quadrangular single crystal semiconductor substrates to a supporting substrate having an insulating surface with the bonding layer interposed therebetween; wherein the bonding the plurality of substantially quadrangular single crystal semiconductor substrates comprises exposing at least a portion of the supporting substrate between at least two of the substantially quadrangular single crystal semiconductor substrates; separating each of the plurality of substantially quadrangular single crystal semiconductor substrates at the damaged layer so that a plurality of single crystal semiconductor layers are left over the supporting substrate; and forming one or a plurality of display panels from each of the plurality of single crystal semiconductor layers, and wherein each vertex of the plurality of substantially quadrangular single crystal semiconductor substrates is provided on each circumference of the plurality of substantially circular single crystal semiconductor wafers.

2. The manufacturing method of a display device according to claim 1, wherein a surface area of each of the plurality of substantially quadrangular single crystal semiconductor substrates accounts for 50% or more of a surface area of each of the plurality of substantially circular single crystal semiconductor wafers.

3. The manufacturing method of a display device according to claim 1, wherein the plurality of substantially quadrangular single crystal semiconductor substrates is arranged over the supporting substrate so as to be separated from each other.

4. The manufacturing method of a display device according to claim 1,
wherein surfaces of the plurality of single crystal semiconductor layers are flattened by irradiating the plurality of single crystal semiconductor layers with a laser beam in a nitrogen atmosphere.

5. The manufacturing method of a display device according to claim 4, wherein the plurality of single crystal semiconductor layers are heated at a temperature of 250 to 600° C. on irradiating with the laser beam.

6. A manufacturing method of a display panel comprising the steps of: cutting each of a plurality of substantially circular silicon wafers of 400 mm or more in diameter into a substantially quadrangular single crystal semiconductor substrate; forming a damaged layer by implantation of hydrogen ions in each of the plurality of substantially quadrangular single crystal semiconductor substrates; bonding the plurality of substantially quadrangular single crystal semiconductor substrates to a supporting substrate having an insulating surface after the step of forming the damaged layer; wherein the bonding the plurality of substantially quadrangular single crystal semiconductor substrates comprises exposing at least a portion of the supporting substrate between at least two of the substantially quadrangular single crystal semiconductor substrates; forming a plurality of single crystal semiconductor layers on the supporting substrate so as to be separated from each other, by separating each of the plurality of substantially quadrangular single crystal semiconductor substrates at the damaged layer; and forming an element region in one of the plurality of single crystal semiconductor layers, wherein the element region has a screen of more than or equal to 10 inches and less than or equal to 15 inches, wherein a surface area of each of the plurality of substantially quadrangular single crystal semiconductor substrates accounts for 50% or more of a surface area of each of the plurality of substantially circular silicon wafers, and wherein each vertex of the plurality of substantially quadrangular single crystal semiconductor substrates is provided on each circumference of the plurality of substantially circular silicon wafers.

7. A manufacturing method of a display panel comprising the steps of: cutting each of a plurality of substantially circular silicon wafers of 400 mm or more in diameter into a substantially quadrangular single crystal semiconductor substrate; forming a damaged layer by implantation of hydrogen ions in each of the plurality of substantially quadrangular single crystal semiconductor substrates; bonding the plurality of substantially quadrangular single crystal semiconductor substrates to a supporting substrate having an insulating surface after the step of forming the damaged layer; wherein the bonding the plurality of substantially quadrangular single crystal semiconductor substrates comprises exposing at least a portion of the supporting substrate between at least two of the substantially quadrangular single crystal semiconductor substrates; forming a plurality of single crystal semiconductor layers on the supporting substrate so as to be separated from each other, by separating each of the plurality of substantially quadrangular single crystal semiconductor substrates at the damaged layer; and forming 10 or more display panels having a screen size of more than or equal to 2 inches and less than or equal to 7 inches from each of the plurality of single crystal semiconductor layers, wherein a surface area of each of the plurality of substantially quadrangular single crystal semiconductor substrates accounts for 50% or more of a surface area of each of the plurality of substantially circular silicon wafers, and wherein each vertex of the plurality of substantially quadrangular single crystal semiconductor substrates is provided on each circumference of the plurality of substantially circular silicon wafers.

8. The manufacturing method of a display panel according to claim 6, wherein each of the plurality of substantially circular silicon wafers is 450 mm or 18 inches in diameter.

9. The manufacturing method of a display panel according to claim 7, wherein each of the plurality of substantially circular silicon wafers is 450 mm or 18 inches in diameter.

10. The manufacturing method of a display panel according to claim 6, wherein the element region in which the screen is formed comprises a plurality of pixels.

11. The manufacturing method of a display panel according to claim 6, further comprising: forming a driver circuit in one of the plurality of single crystal semiconductor layers, wherein the driver circuit is adjacent to the element region in which the screen is formed.

12. A manufacturing method of a semiconductor substrate comprising the steps of: cutting each of a plurality of substantially circular silicon wafers of 400 mm or more in diameter into a substantially quadrangular single crystal semiconductor substrate; forming a damaged layer by implantation of hydrogen ions in each of the plurality of substantially quadrangular single crystal semiconductor substrates; bonding the plurality of substantially quadrangular single crystal semiconductor substrates to a supporting substrate having an insulating surface after the step of forming the damaged layer; wherein the bonding the plurality of substantially quadrangular single crystal semiconductor substrates comprises exposing at least a portion of the supporting substrate between at least two of the substantially quadrangular single crystal semiconductor substrates; and forming a plurality of single crystal semiconductor layers on the supporting substrate so as to be separated from each other, by separating the plurality of substantially quadrangular single crystal semiconductor substrates at the damaged layer, wherein a surface area of each of the plurality of substantially quadrangular single crystal semiconductor substrates accounts for 50% or more of a surface area of each of the plurality of substantially circular silicon wafers, and wherein each vertex of the plurality of substantially quadrangular single crystal semiconductor substrates is provided on each circumference of the plurality of substantially circular silicon wafers.

13. The manufacturing method of a semiconductor substrate according to claim 12, wherein each of the plurality of substantially circular silicon wafers is 450 mm or 18 inches in diameter.

14. The manufacturing method of a display device according to claim 1,
wherein an end portion of the supporting substrate is exposed, and
wherein a width of the end portion is wider than a width of a space between adjacent single crystal semiconductor layers.

15. The manufacturing method of a display panel according to claim 6,
wherein an end portion of the supporting substrate is exposed, and
wherein a width of the end portion is wider than a width of a space between adjacent single crystal semiconductor layers.

16. The manufacturing method of a display panel according to claim 7,
wherein an end portion of the supporting substrate is exposed, and
wherein a width of the end portion is wider than a width of a space between adjacent single crystal semiconductor layers.

17. The manufacturing method of a semiconductor substrate according to claim 12,
wherein an end portion of the supporting substrate is exposed, and
wherein a width of the end portion is wider than a width of a space between adjacent single crystal semiconductor layers.

18. The manufacturing method of a display device according to claim 1, further comprising the step of:
chamfering a peripheral end portion of each of the plurality of substantially quadrangular single crystal semiconductor substrates before the step of bonding the plurality of substantially quadrangular single crystal semiconductor substrates to the supporting substrate.

19. The manufacturing method of a display panel according to claim 6, further comprising the step of:
chamfering a peripheral end portion of each of the plurality of substantially quadrangular single crystal semiconductor substrates before the step of bonding the plurality of substantially quadrangular single crystal semiconductor substrates to the supporting substrate.

20. The manufacturing method of a display panel according to claim 7, further comprising the step of:
chamfering a peripheral end portion of each of the plurality of substantially quadrangular single crystal semiconductor substrates before the step of bonding the plurality of substantially quadrangular single crystal semiconductor substrates to the supporting substrate.

21. The manufacturing method of a semiconductor substrate according to claim 12, further comprising the step of:
chamfering a peripheral end portion of each of the plurality of substantially quadrangular single crystal semiconductor substrates before the step of bonding the plurality of substantially quadrangular single crystal semiconductor substrates to the supporting substrate.

22. The manufacturing method of a display device according to claim 1, wherein the hydrogen ions are $H_3^+$ ions of 50% or more with respect to total ions.

23. The manufacturing method of a display device according to claim 1, further comprising:
generating a crack in the damaged layer by thermal treatment after the step of bonding the plurality of substantially quadrangular single crystal semiconductor substrates to the supporting substrate.

24. The manufacturing method of a display panel according to claim 6,
wherein a thickness of each of the plurality of single crystal semiconductor layers is 100 nm or less.

25. The manufacturing method of a display panel according to claim 7,
wherein a thickness of each of the plurality of single crystal semiconductor layers is 100 nm or less.

26. The manufacturing method of a semiconductor substrate according to claim 12,
wherein a thickness of each of the plurality of single crystal semiconductor layers is 100 nm or less.

* * * * *